(12) United States Patent
Kim et al.

(10) Patent No.: US 12,165,734 B2
(45) Date of Patent: Dec. 10, 2024

(54) NONVOLATILE MEMORY DEVICE AND STORAGE DEVICE

(71) Applicant: SAMSUNG ELECTRONICS CO., LTD., Suwon-si (KR)

(72) Inventors: Minho Kim, Seongnam-si (KR); Hyunmook Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 275 days.

(21) Appl. No.: 17/895,642

(22) Filed: Aug. 25, 2022

(65) Prior Publication Data

US 2023/0169999 A1    Jun. 1, 2023

(30) Foreign Application Priority Data

Nov. 29, 2021 (KR) .................. 10-2021-0167174
Feb. 3, 2022 (KR) .................. 10-2022-0014359

(51) Int. Cl.
  *G11C 7/10*      (2006.01)
  *G06F 7/544*     (2006.01)
  *G11C 29/52*     (2006.01)

(52) U.S. Cl.
  CPC .......... *G11C 7/1039* (2013.01); *G06F 7/5443* (2013.01); *G11C 29/52* (2013.01)

(58) Field of Classification Search
  CPC ...... G11C 7/1039; G11C 29/52; G06F 7/5443
  USPC .................................................... 365/230.06
  See application file for complete search history.

(56) References Cited

U.S. PATENT DOCUMENTS

| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,515,087 | B2 | 12/2016 | Son et al. |
| 10,937,766 | B2 | 3/2021 | Liu |
| 10,971,487 | B2 | 4/2021 | Oh et al. |
| 10,984,866 | B2 | 4/2021 | Oh |
| 11,355,194 | B2 * | 6/2022 | Yun ........................ H10B 43/40 |
| 2011/0233648 | A1 | 9/2011 | Seol et al. |
| 2020/0350286 | A1 | 11/2020 | Cheng et al. |

(Continued)

OTHER PUBLICATIONS

Song, "Many-Tier Vertical GAAFET (V-FET) for Ultra-Miniaturized Standard Cell Designs Beyond 5 nm", IEEE Access, Aug. 10, 2020, vol. 8, (15 total pages).

(Continued)

*Primary Examiner* — Huan Hoang
(74) *Attorney, Agent, or Firm* — Sughrue Mion, PLLC

(57) ABSTRACT

A nonvolatile memory device includes a memory cell region and a peripheral circuit region disposed below the memory cell region. The peripheral circuits include a page buffer, a row decoder, and other peripheral circuits, wherein the page buffer is included in a page buffer block disposed on a lower surface of the first semiconductor substrate to be distinguished from other circuits included in the peripheral circuit region in a first direction perpendicular to an upper surface of the first semiconductor substrate, is connected to the memory cell region through a connection portion penetrating through the first semiconductor substrate, and includes a plurality of vertical transistors each defined by a source region, a channel region, and a drain region stacked in sequence in the first direction.

20 Claims, 25 Drawing Sheets

(56) References Cited

U.S. PATENT DOCUMENTS

2021/0249068 A1   8/2021  Oh
2021/0265319 A1   8/2021  Liu
2021/0287982 A1   9/2021  Kim et al.

OTHER PUBLICATIONS

Kotabe et al., "A Low-Power Four-Transistor SRAM Cell With a Stacked Vertical Poly-Silicon PMOS and a Dual-Word-Voltage Scheme", IEEE Journal of Solid-State Circuits, vol. 40, No. 4, Apr. 2005, (7 pages total).

* cited by examiner

NONVOLATILE MEMORY DEVICE AND STORAGE DEVICE

CROSS-REFERENCE TO RELATED APPLICATION(S)

This application claims benefit of priority to Korean Patent Application No. 10-2021-0167174 filed on Nov. 29, 2021 and Korean Patent Application No. 10-2022-0014359 filed on Feb. 3, 2022 in the Korean Intellectual Property Office, the disclosures of which are incorporated herein by reference in their entirety.

BACKGROUND

Example embodiments of the present disclosure relate to a nonvolatile memory device and a storage device.

Recently, it has been required for nonvolatile memory devices to have increased integration density and also high operating speeds to process greater amounts of data within a short period of time. To improve integration density and to increase storage capacity of a nonvolatile memory device, the number of channel structures included in each of a plurality of memory blocks included in a nonvolatile memory device may be increased. However, as the number of channel structures including memory cells increases, the number of page buffers for sensing values stored in the memory cells may also increase. When the number of page buffers increases, the size of the peripheral circuit region of the nonvolatile memory device may increase excessively.

SUMMARY

An example embodiment of the present disclosure is to provide a nonvolatile memory device which may, by implementing a page buffer included in a peripheral circuit region using a vertical transistor, address the issue of an increase of a size of the page buffer caused by increasing storage capacity.

According to an example embodiment of the present disclosure, a nonvolatile memory device includes a memory cell region including a first semiconductor substrate and a plurality of memory cells disposed on the first semiconductor substrate, where the plurality of memory cells are defined by gate electrodes stacked and spaced apart from each other and channel structures penetrating through the gate electrodes and connected to the first semiconductor substrate; and a peripheral circuit region disposed below the memory cell region, including a second semiconductor substrate and peripheral circuits disposed on the second semiconductor substrate and controlling the plurality of memory cells, where the peripheral circuits include a page buffer, a row decoder, and other peripheral circuits, wherein the page buffer is included in a page buffer block disposed on a lower surface of the first semiconductor substrate to be distinguished from other circuits included in the peripheral circuit region in a first direction perpendicular to an upper surface of the first semiconductor substrate, is connected to the memory cell region through a connection portion penetrating through the first semiconductor substrate, and includes a plurality of vertical transistors each defined by a source region, a channel region, and a drain region stacked in sequence in the first direction.

According to an example embodiment of the present disclosure, a nonvolatile memory device includes a memory cell region including a first semiconductor substrate and a plurality of memory cells disposed on the first semiconductor substrate, where the plurality of memory cells are defined by gate electrodes stacked and spaced apart from each other and channel structures penetrating through the gate electrodes and connected to the first semiconductor substrate; and a peripheral circuit region disposed below the memory cell region, and including a second semiconductor substrate and peripheral circuits disposed on the second semiconductor substrate and controlling the plurality of memory cells, where the peripheral circuits include a page buffer, a row decoder, and other peripheral circuits, wherein the page buffer is connected to the memory cell region through a connection portion penetrating through the first semiconductor substrate, includes a plurality of vertical transistors each defined by a source region, a channel region, and a drain region stacked in sequence in the first direction perpendicular to the upper surface of the first semiconductor substrate, and is distinguished from the row decoder and the other peripheral circuits in a second direction perpendicular to the first direction.

According to an example embodiment of the present disclosure, a storage device includes a first semiconductor structure including a memory cell region including a first semiconductor substrate and a plurality of memory cells disposed on the first semiconductor substrate, and a first metal pad disposed on the memory cell region, where the memory cell region includes gate electrodes stacked and spaced apart from each other on the first semiconductor substrate and channel structures penetrating through the gate electrodes and connected to the first semiconductor substrate; and a second semiconductor structure including a peripheral circuit region including a second semiconductor substrate and a page buffer disposed on the second semiconductor substrate, and a second metal pad disposed on the peripheral circuit region, wherein the page buffer includes a plurality of vertical transistors performing a sensing operation on the plurality of memory cells and defined by a source region, a channel region, and a drain region stacked in sequence in the first direction perpendicular to an upper surface of the first semiconductor substrate, and the first metal pad and the second metal pad are bonded to each other in the direction perpendicular to the upper surface of the first semiconductor substrate.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
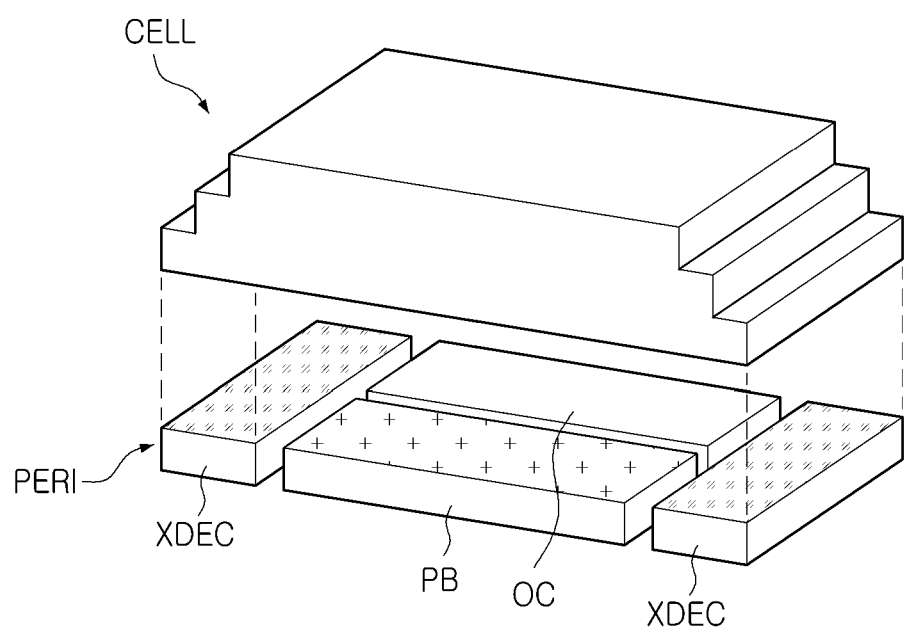
FIG. 1 is a perspective diagram illustrating a structure of a structure of a nonvolatile memory device according to an example embodiment of the present disclosure.

FIG. 1 is a perspective diagram illustrating a structure of a structure of a nonvolatile memory device according to an example embodiment.

Referring to FIG. 1, a nonvolatile memory device may have a cell on pen (COP) structure. For example, a nonvolatile memory device having a COP structure may include a memory cell region CELL including a plurality of memory cells formed in a 3D structure and a peripheral circuit region PERI including peripheral circuits implemented as planar transistors.

The peripheral circuit region PERI may include a page buffer PB, a row decoder XDEC, and other peripheral circuits OC. The row decoder XDEC may be disposed below a staircase structure in which a step difference is formed to select a word line, and a page buffer PB and other peripheral circuits OC may be disposed between the row decoder XDEC.

Recently, as the number of stacks of memory cells included in a nonvolatile memory device has increased and the number of bits stored per memory cell has increased, storage capacity of a nonvolatile memory device has increased. Accordingly, when a general page buffer PB is used, the time required for a read/write operation may increase, and it may be necessary to increase the size of the page buffer PB to ensure operating performance of the nonvolatile memory device.

Also, the size of a storage device including a nonvolatile memory device has been decreased due to integration. Accordingly, it may be necessary to sufficiently secure a space of the peripheral circuit region PERI.

In the nonvolatile memory device in an example embodiment, a latch structure included in the page buffer PB may be implemented using a vertical transistor, such that the space of the peripheral circuit region PERI may be used to the maximum and the issue of space shortage may be addressed.

Figure 2:
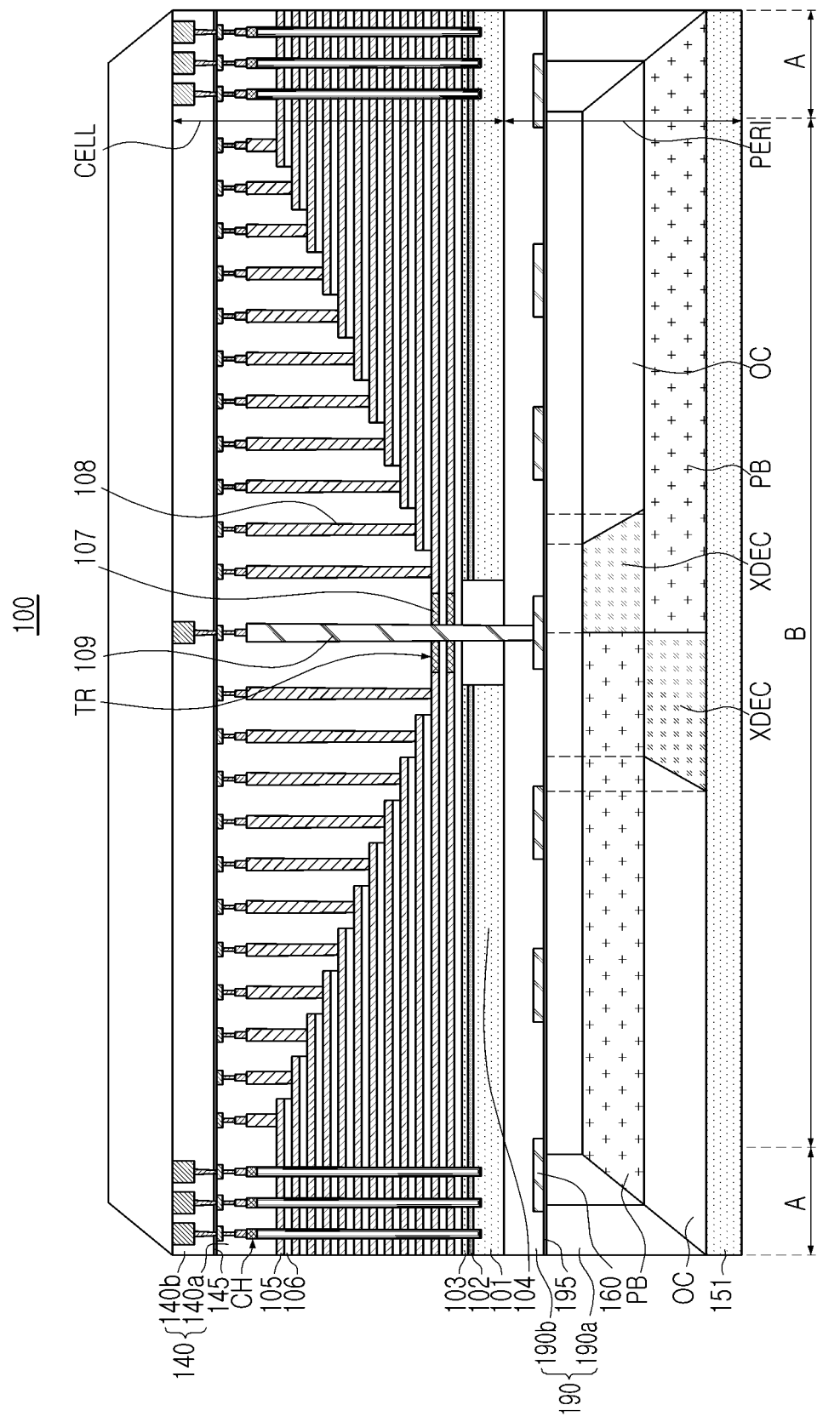
FIG. 2 is a diagram illustrating a nonvolatile memory device according to an example embodiment of the present disclosure.

FIG. 2 is a diagram illustrating a nonvolatile memory device according to an example embodiment.

Referring to FIG. 2, a nonvolatile memory device 100 in an example embodiment may include a memory cell region CELL including a first semiconductor substrate 101, and a through region TR including a connection portion 109 electrically connecting the peripheral circuit region PERI including a second semiconductor substrate 151 to the memory cell region CELL.

The memory cell region CELL may be disposed on an upper end of the peripheral circuit region PERI. However, an example embodiment thereof is not limited thereto. Differently from the aforementioned example, the memory cell region CELL may be disposed on a lower end of the peripheral circuit region PERI. The connection portion 109 may be disposed to extend from the memory cell region CELL to the peripheral circuit region PERI.

The memory cell region CELL may include a first semiconductor substrate 101 having a first region A and a second region B, first and second horizontal conductive layers 102 and 103 on the first semiconductor substrate 101, and a substrate insulating layer 104 penetrating a portion of the first semiconductor substrate 101. The memory cell region CELL may include gate electrodes 105 stacked on the first semiconductor substrate 101 in a first direction (e.g., Z-direction), and insulating layers 106 stacked alternately with the gate electrodes 105.

In the first region A of the first semiconductor substrate 101, the gate electrodes 105 may be vertically stacked and the channel structures CH may be disposed, and a plurality of memory cells may be disposed in the first region A. For example, in the first region A, the memory cell region CELL may include channel structures CH disposed to penetrate through the stack structure of the gate electrodes 105 and the insulating layers 106.

In the second region B of the first semiconductor substrate 101, the gate electrodes 105 may extend by different lengths and may form a step structure in the form of a staircase, and a plurality of memory cells may be electrically connected to the peripheral circuit region PERI in the second region B. The second region B may be disposed on at least one end of the first region A in at least one direction perpendicular to the first direction, that is, for example, in the second direction (X-direction).

In the second region B, the gate electrodes 105 may be connected to the gate contacts 108 through exposed ends. The memory cell region CELL may further include a first cell region insulating layer 140a covering the gate electrodes 105 and the gate contacts 108, and an upper protective layer 145 disposed on the first cell region insulating layer 140a. Wiring structures electrically connected to the gate electrodes 105 and the channel structures CH may be disposed on the upper protective layer 145, and the wiring structures may be covered by the second cell region insulating layer 140b.

The first and second cell region insulating layers 140a and 140b (140) may be formed of an insulating material, and the upper protective layer 145 for preventing contamination of wiring structures with a metal material may be formed of an insulating material different from that of the cell region insulating layer 150, and may include, for example, silicon nitride.

However, the structure of the memory cell region CELL may not be limited to the example illustrated in FIG. 2. For example, the memory cell region CELL may further include a third region in which the gate electrodes 105 may not extend and another connection portion connecting the memory cell region CELL to the peripheral circuit region PERI may be disposed.

The first semiconductor substrate 101 may have an upper surface extending in a second direction (e.g., X-direction)

and a third direction (e.g., Y-direction). The first semiconductor substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The first semiconductor substrate 101 may further include impurities. The first semiconductor substrate 101 may be provided as a polycrystalline semiconductor layer such as a polycrystalline silicon layer or an epitaxial layer.

The first and second horizontal conductive layers 102 and 103 may be stacked on an upper surface of the first semiconductor substrate 101. At least a portion of the first and second horizontal conductive layers 102 and 103 may function as a portion of a common source line of the nonvolatile memory device 100, such as, for example, a common source line together with the first semiconductor substrate 101. The first and second horizontal conductive layers 102 and 103 may include a semiconductor material, such as polycrystalline silicon. In this case, at least the first horizontal conductive layer 102 may be a doped layer, and the second horizontal conductive layer 103 may be a doped layer or a layer including impurities diffused from the first horizontal conductive layer 102.

The substrate insulating layer 104 may be disposed in a region from which portions of the first semiconductor substrate 101 and the first and second horizontal conductive layers 102 and 103 are removed, such that the substrate insulating layer 104 may be surrounded by the first semiconductor substrate 101 and the first and second horizontal conductive layers 102 and 103. The lower surface of the substrate insulating layer 104 may be coplanar with the lower surface of the first semiconductor substrate 101 or may be disposed on a level lower than the lower surface of the first semiconductor substrate 101. In example embodiments, the substrate insulating layer 104 may be disposed in a region from which only the first semiconductor substrate 101 is removed. In this case, the substrate insulating layer 104 may have an upper surface substantially coplanar with the upper surface of the first semiconductor substrate 101, and an insulating layer surrounded by the first and second horizontal conductive layers 102 and 103 may be further disposed in an upper portion. The substrate insulating layer 104 may be formed of an insulating material, and may include, for example, silicon oxide, silicon oxynitride, or silicon nitride.

The gate electrodes 105 may be vertically stacked and spaced apart from each other on the first semiconductor substrate 101 and may form a stack structure. The gate electrodes 105 may include electrodes forming a ground select transistor, a plurality of memory cells, and a string select transistor in sequence from the first semiconductor substrate 101. The number of gate electrodes 105 included in the plurality of memory cells may be determined depending on capacity of the nonvolatile memory device 100.

The gate electrodes 105 may include a metal material, such as, for example, tungsten (W). In example embodiments, the gate electrodes 105 may include polycrystalline silicon or a metal silicide material. For example, the gate electrodes 105 may further include a diffusion barrier layer, and, for example, the diffusion barrier layer may include tungsten nitride (WN), tantalum nitride (TaN), titanium nitride (TiN), or a combination thereof. The insulating layers 106 disposed between the gate electrodes 105 may include an insulating material such as silicon oxide or silicon nitride.

Each of the channel structures CH may form a single memory cell string, and may be spaced apart from each other while forming rows and columns on the first region A. The channel structures CH may be disposed to form a grid pattern on the X-Y plane or may be disposed in a zigzag shape in one direction. The channel structures CH may have a columnar shape, and may have inclined side surfaces of which a width may decrease toward the first semiconductor substrate 101 according to an aspect ratio.

The through region TR may include a connection portion 109 penetrating through the first semiconductor substrate 101 from an upper portion of the memory cell region CELL, extending in the first direction (e.g., the Z-direction), and electrically connecting the memory cell region CELL to the peripheral circuit region PERI, and an insulating region surrounding the connection portion 109. The insulating region may include sacrificial insulating layers 107, insulating layers 106 disposed perpendicular to the sacrificial insulating layers 107, and the substrate insulating layer 104.

For example, the size, arrangement, and shape of the through region TR may be varied. In FIG. 2, the through region TR may be disposed in a center of the second region B, but an example embodiment thereof is not limited thereto. The through region TR may be disposed in a different position and may be disposed in the first region A with a predetermined distance therebetween. The connection portion 109 may include a conductive material, such as, for example, a metal material such as tungsten (W), copper (Cu), or aluminum (Al).

The peripheral circuit region PERI may include the second semiconductor substrate 151 and peripheral circuits disposed on the second semiconductor substrate 151 and controlling the plurality of memory cells. The peripheral circuits may be covered by the peripheral region insulating layers 190a and 190b (190). The peripheral region insulating layer 190 may be divided into a first peripheral region insulating layer 190a and a second peripheral region insulating layer 190b by a lower passivation layer 195. The peripheral circuits may be electrically connected to the memory cell region CELL through the lower wiring structures 160 disposed on one surface of the lower protective layer 195.

In the nonvolatile memory device 100 in an example embodiment, the peripheral circuits included in the peripheral circuit region PERI may include a page buffer PB, a row decoder XDEC, and other peripheral circuits OC. At least a portion of the peripheral circuits may include a plurality of vertical transistors defined by a source region, a channel region, and a drain region stacked in sequence in a first direction (e.g., a Z-direction). For example, the page buffer PB included in the nonvolatile memory device 100 in an example embodiment may be implemented as a plurality of vertical transistors.

In the nonvolatile memory device 100 illustrated in FIG. 2, the page buffer PB may be connected to the memory cell region CELL through the connection portion 109 penetrating through the first semiconductor substrate 101. The page buffer PB may be distinguished from the row decoder XDEC and other peripheral circuits in a second direction (e.g., X-direction) perpendicular to the first direction.

In the nonvolatile memory device 100 in an example embodiment, the page buffer PB may include a plurality of page buffers corresponding to the plurality of memory cells, respectively. For example, the row decoder XDEC may be disposed in the center of the peripheral circuit region PERI, and the row decoder XDEC may be surrounded by the page buffer PB. A control signal may be applied to the row decoder XDEC through the connection portion 109. Accordingly, a plurality of memory cells may be disposed on both sides of the connection portion 109 in the nonvolatile memory device 100 in an example embodiment. However, the configuration of circuit devices included in the peripheral circuit region PERI may not be limited to the example illustrated in FIG. 2.

Figure 3A:
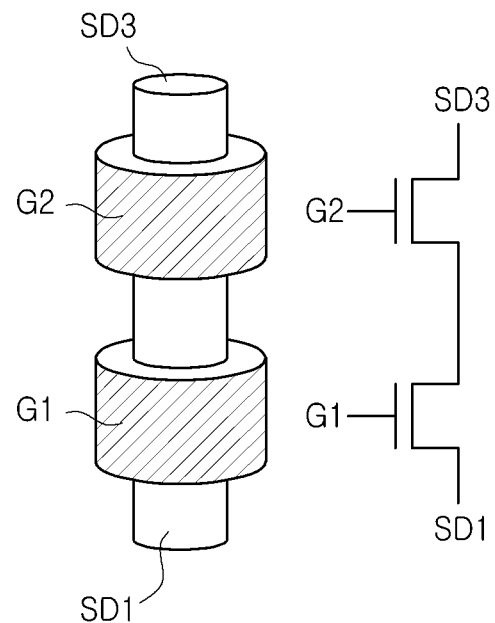
FIGS. 3A and 3B are diagrams illustrating a vertical transistors included in a nonvolatile memory device according to an example embodiment of the present disclosure.
Figure 3B:
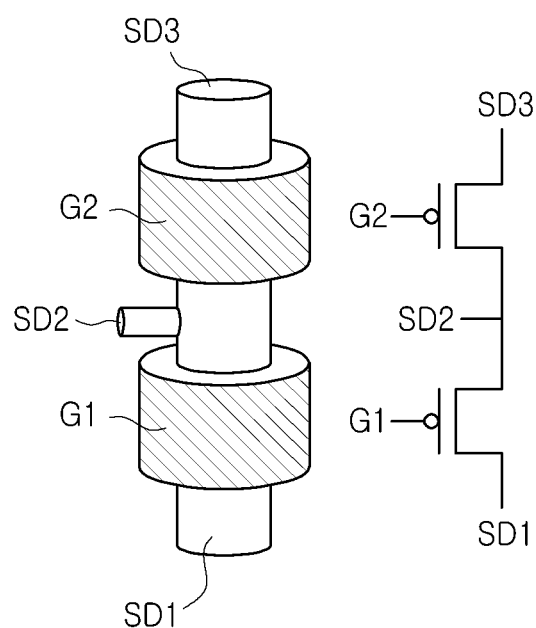
Figure 3C:
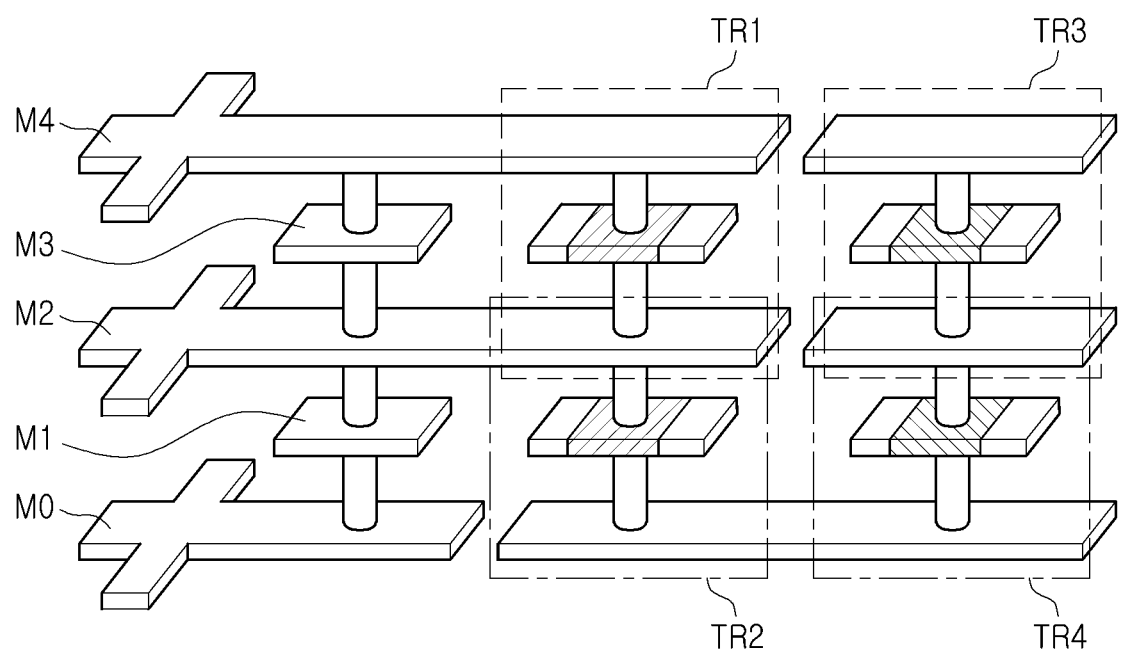
FIG. 3C is a diagram illustrating vertical transistors included in a page buffer in a nonvolatile memory device according to an example embodiment of the present disclosure.

FIGS. 3A and 3B are diagrams illustrating a vertical transistors included in a nonvolatile memory device according to an example embodiment. FIG. 3C is a diagram illustrating vertical transistors included in a page buffer in a nonvolatile memory device according to an example embodiment.

At least a portion of the peripheral circuits included in the peripheral circuit region PERI of the nonvolatile memory device 100 in an example embodiment may be implemented by a vertical transistor. For example, the page buffer PB may include a plurality of page buffers corresponding to a plurality of memory cells, and each of the plurality of page buffers may include a latch structure implemented by four vertical transistors. For example, the plurality of page buffers may correspond to the plurality of memory cells, respectively. However, an example embodiment thereof is not limited thereto.

Referring to FIGS. 3A and 3B, an NMOS transistor among the vertical transistors may be implemented as illustrated in FIG. 3A, and a PMOS transistor may be implemented as illustrated in FIG. 3B.

The vertical transistor may be implemented by a first source/drain regions SD1, a first gate electrode G1, a second gate electrode G2, and a third source/drain region SD3 stacked in a vertical direction. Referring to FIG. 3B, the vertical transistor may be implemented to have a structure in which a metal structure may be connected to the second source/drain region SD2. In the vertical transistor, a channel region surrounded by the first gate electrode G1 and/or the second gate electrode G2 may be formed of a nanowire.

Referring to FIG. 3C, the peripheral circuit region PERI included in the nonvolatile memory device 100 in an example embodiment may include wiring structures M0, M1, M2, M3, and M4 formed in a plurality of layers disposed on different levels. Peripheral circuits included in the peripheral circuit region PERI may be formed by connecting the wiring structures M0, M1, M2, M3, and M4 to other devices.

For example, a latch structure included in the page buffer PB included in the peripheral circuit region PERI may be implemented by four vertical transistors. The vertical transistors may be arranged two by two in the vertical direction. For example, the first transistor TR1 and the second transistor TR2 may be NMOS transistors illustrated in FIG. 3A, and the third transistor TR3 and the fourth transistor TR4 may be PMOS transistors illustrated in FIG. 3B. However, an example embodiment thereof is not limited thereto.

Since a structure such as an inverter, a buffer, or the like, may be implemented using a vertical transistor, the row decoder XDEC and other peripheral circuits OC may also be formed as vertical transistors in addition to the page buffer PB.

Figure 4:
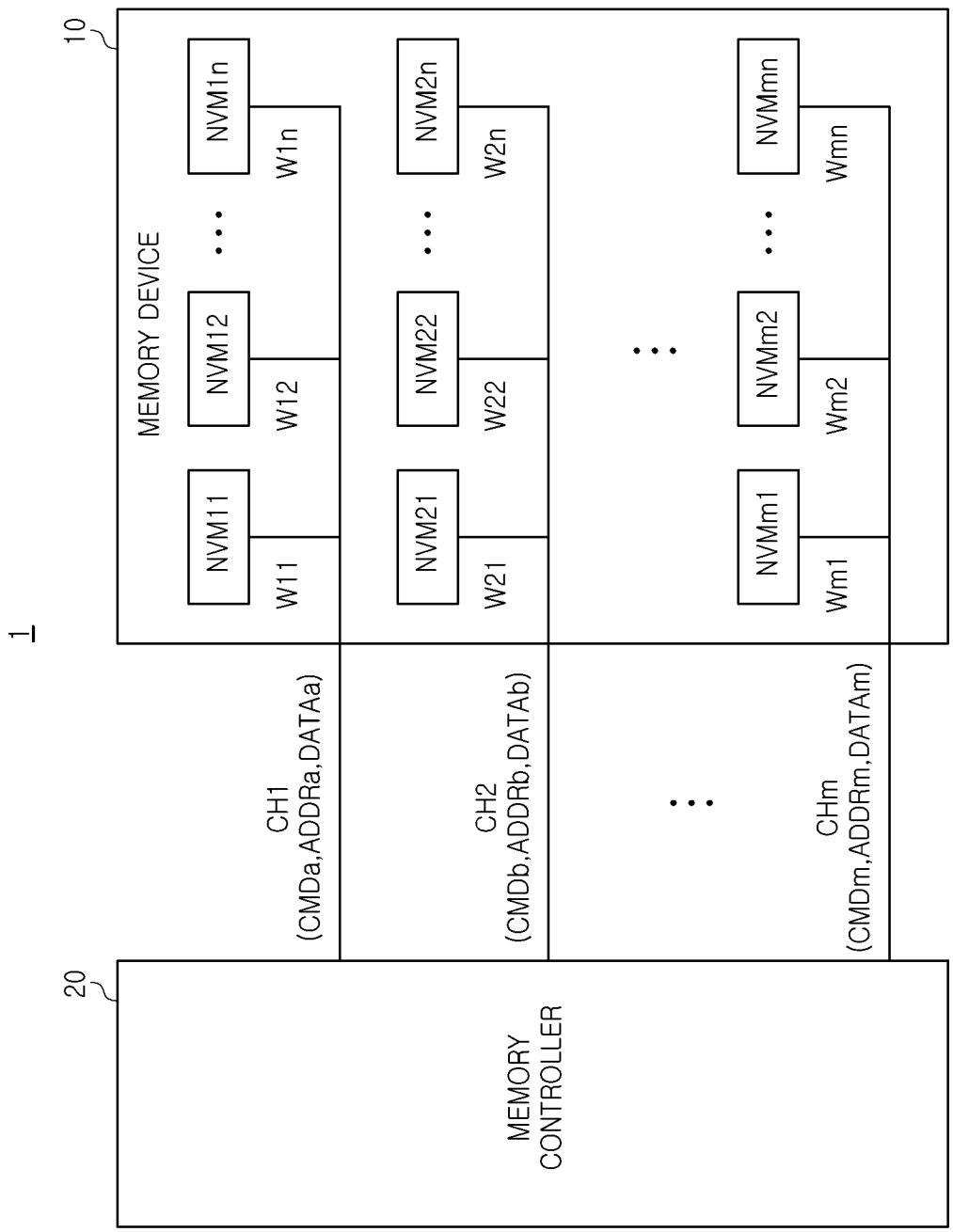
FIG. 4 is a block diagram illustrating a memory system including a nonvolatile memory device according to an example embodiment of the present disclosure.

FIG. 4 is a block diagram illustrating a memory system including a nonvolatile memory device according to an example embodiment.

Referring to FIG. 4, the memory system 1 may include a memory device 10 and a memory controller 20. The memory system 1 may support a plurality of channels CH1-CHm, and the memory device 10 and the memory controller 20 may be connected through the plurality of channels CH1-CHm. For example, the memory system 1 may be implemented as a storage device such as a solid state drive (SSD).

The memory device 10 may include a plurality of nonvolatile memory devices NVM11-NVMmn. Each of the nonvolatile memory devices NVM11-NVMmn may be connected to one of the plurality of channels CH1-CHm through a corresponding way. For example, the nonvolatile memory devices NVM11-NVM1n may be connected to the first channel CH1 through the ways W11, W12, . . . , W1n, and the nonvolatile memory devices NVM21, NVM22, . . . , NVM2n may be connected to the second channel CH2 through the ways W21-W2n. A channel CHm is also shown connected to NVMm1, NVMm2, . . . , NVMmn. In an example embodiment, each of the nonvolatile memory devices NVM11-NVMmn may be implemented as an arbitrary memory portion operating in response to an individual command from the memory controller 20. For example, each of the nonvolatile memory devices NVM11-NVMmn may be implemented as a chip or a die, but an example embodiment thereof is not limited thereto.

The memory controller 20 may transmit signals to and receive signals from the memory device 10 through a plurality of channels CH1-CHm. For example, the memory controller 20 may transmit commands CMDa-CMDm, addresses ADDRa-ADDRm, and data DATAa-DATAm to the memory device 10 through channels CH1-CHm, or may receive data DATAa-DATAm from the memory device 10.

The memory controller 20 may select one of the nonvolatile memory devices NVM11-NVMmn connected to the corresponding channel through each channel, and may transmit signals to and receive signals from the selected nonvolatile memory device. For example, the memory controller 20 may select the nonvolatile memory device NVM11 from among the nonvolatile memory devices NVM11-NVM1n connected to the first channel CH1. The memory controller 20 may transmit the command CMDa, the address ADDRa, and the data DATAa to the selected nonvolatile memory device NVM11 through the first channel CH1 or may receive the data DATAa from the selected nonvolatile memory device NVM11.

The memory controller 20 may transmit signals to and receive signals from the memory device 10 in parallel through different channels. For example, the memory controller 20 may transmit the command CMDb to the memory device 10 through the second channel CH2 while transmitting the command CMDa to the memory device 10 through the first channel CH1. For example, the memory controller 20 may receive data DATAb from the memory device 10 through the second channel CH2 while receiving the data DATAa from the memory device 10 through the first channel CH1.

The memory controller 20 may control overall operation of the memory device 10. The memory controller 20 may control each of the nonvolatile memory devices NVM11-NVMmn connected to the channels CH1-CHm by transmitting signals to the channels CH1-CHm. For example, the memory controller 20 may control a selected nonvolatile memory device among the nonvolatile memory devices NVM11-NVM1n by transmitting a command CMDa and an address ADDRa to the first channel CH1.

Each of the nonvolatile memory devices NVM11-NVMmn may operate under control of the memory controller 20. For example, the nonvolatile memory device NVM11 may program the data DATAa in response to the command CMDa and the address ADDRa provided to the first channel CH1. For example, the nonvolatile memory device NVM21 may read the data DATAb in response to the command CMDb and the address ADDRb provided to the second channel CH2, and may transfer the read data DATAb to the memory controller 20.

In FIG. 4, the memory device 10 may communicate with the memory controller 20 through m number of channels, and the memory device 10 may include n number of nonvolatile memory devices corresponding to each channel, but the number of channels and the number of nonvolatile memory devices connected to a channel may be varied.

Figure 5:
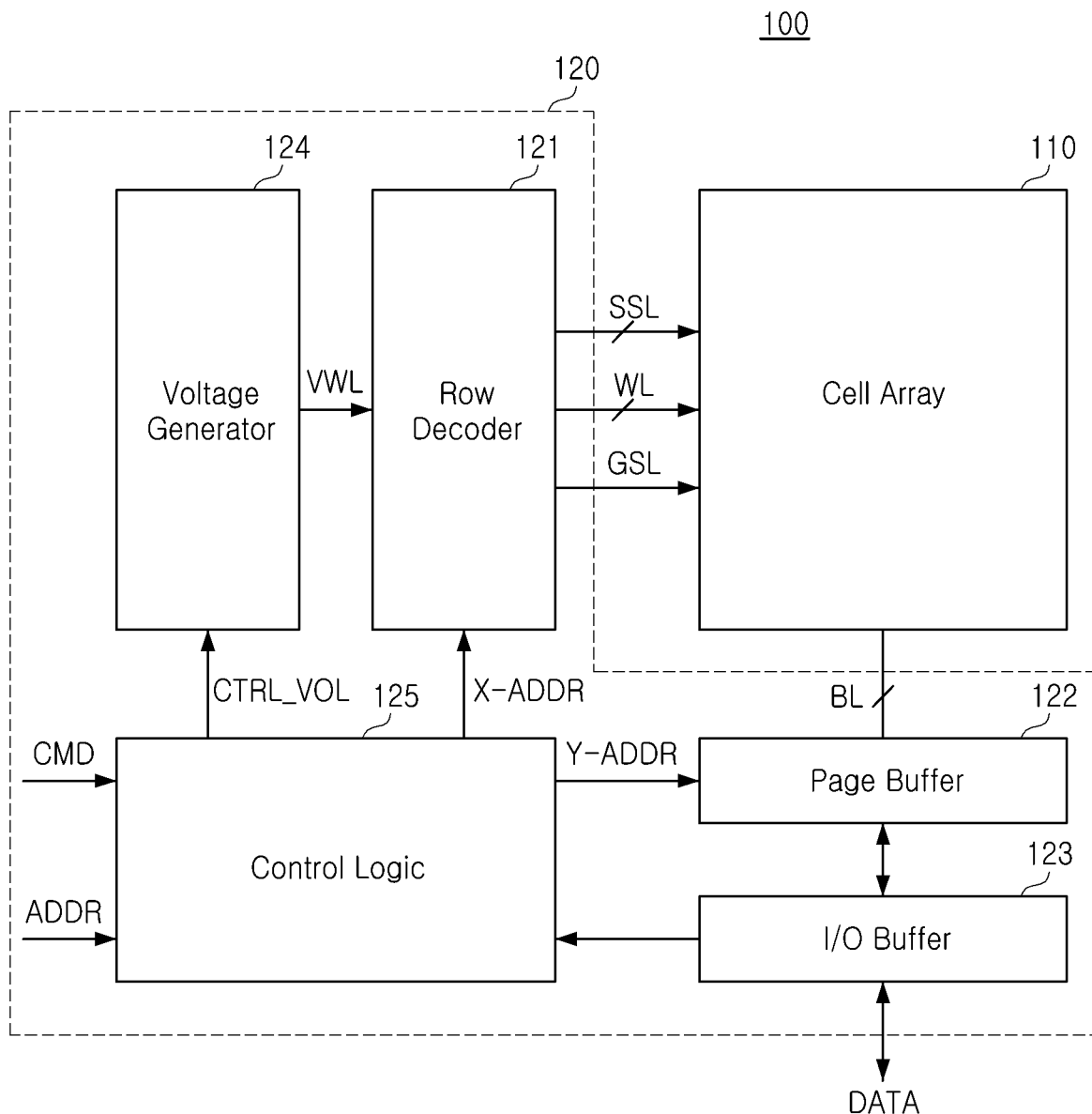
FIG. 5 is a block diagram illustrating a nonvolatile memory device according to an example embodiment of the present disclosure.

FIG. 5 is a block diagram illustrating a nonvolatile memory device according to an example embodiment.

Referring to FIG. 5, a nonvolatile memory device 100 in an example embodiment may include a memory cell region including a memory cell array 110 and a peripheral circuit including peripheral circuits 120.

The peripheral circuits 120 disposed in the peripheral circuit region of the nonvolatile memory device 100 may include a row decoder 121, a page buffer 122, an input/output buffer 123, a voltage generator 124, and a control logic circuit 125. Although not illustrated in FIG. 5, the nonvolatile memory device 100 may further include column logic, a pre-decoder, a temperature sensor, and the like.

The control logic circuit 125 may generally control various operations in the nonvolatile memory device. The control logic circuit 125 may output various control signals in response to a command CMD and/or an address ADDR input from the memory controller. For example, the control logic circuit 125 may output a voltage control signal CTRL VOL, a row address X-ADDR, and a column address Y-ADDR.

The memory cell array 110 may include a plurality of memory blocks, and each of the plurality of memory blocks may include a plurality of memory cells. The memory cell array 110 may be connected to the page buffer 122 through bit lines BL, and may be connected to the row decoder 121 through word lines WL, string select lines SSL, and ground select lines GSL.

In the nonvolatile memory device 100 in an example embodiment, the memory cell array 110 may include a three-dimensional (3D) memory cell array, and the 3D memory cell array may include a plurality of NAND strings. Each NAND string may include a plurality of memory cells connected to word lines WL stacked vertically on the substrate, respectively. U.S. Pat. Nos. 7,679,133, 8,553,466, 8,654,587, 8,559,235, and U.S. Patent Application Publication No. 2011/0233648 are incorporated herein by reference in their entirety. For example, the memory cell array 110 may include a two-dimensional (2D) memory cell array, and the 2D memory cell array may include a plurality of NAND strings disposed along row and column directions.

The page buffer 122 may include a plurality of page buffers, and the plurality of page buffers may be connected to a plurality of memory cells through a plurality of bit lines BL, respectively. The page buffer 122 may select at least one bit line among the bit lines BL in response to the column address Y-ADDR. The page buffer 122 may operate as a write driver or a sense amplifier depending on an operation mode. For example, during a write operation, the page buffer 122 may apply a bit line voltage corresponding to data to be written to the selected bit line. During a read operation, the page buffer 122 may sense data stored in the first memory cell by sensing a current or voltage of the selected bit line.

The voltage generator 124 may generate various types of voltages for performing a write operation, a read operation, a write verify operation, and an erase operation based on the voltage control signal CTRL VOL. For example, the voltage generator 124 may generate a write voltage, a read voltage, a write verification voltage, an erase voltage, or the like, as the word line voltage VWL.

The row decoder 121 may, in response to the row address X-ADDR, select one of the plurality of word lines WL and may select one of the plurality of string select lines SSL. For example, during a write operation, the row decoder 121 may apply a write voltage and a write verify voltage to a selected word line, and may apply a read voltage to the selected word line during a read operation.

Figure 6:
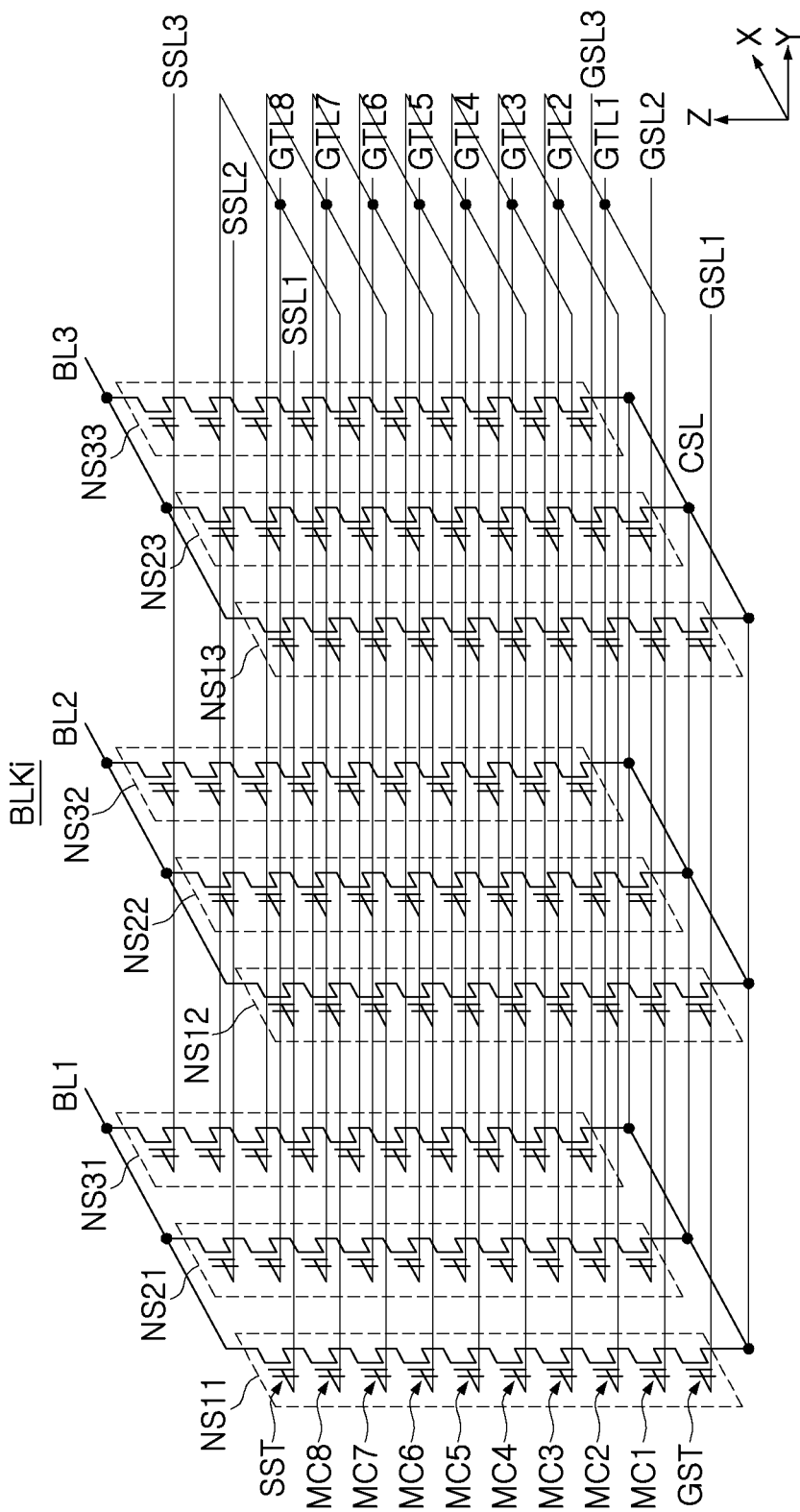
FIG. 6 is a diagram illustrating a 3D VNAND structure applicable to a nonvolatile memory device according to an example embodiment of the present disclosure.

FIG. 6 is an equivalent circuit diagram of a memory block included in a non-volatile memory device according to an example embodiment.

The memory block BLKi illustrated in FIG. 6 may be implemented as a three-dimensional memory block formed in a three-dimensional structure on a semiconductor substrate. For example, a plurality of memory NAND strings included in the memory block BLKi may be formed in a direction perpendicular to the semiconductor substrate.

Referring to FIG. 6, the memory block BLKi may include a plurality of memory NAND strings NS11 to NS33 connected between the bit lines BL1, BL2, and BL3 and the common source line CSL. Each of the plurality of memory NAND strings NS11 to NS33 may include a string select transistor SST, a plurality of memory cells MC1, MC2, ..., MC8, and a ground select transistor GST. In FIG. 4, each of the plurality of memory NAND strings NS11 to NS33 may include eight memory cells MC1, MC2, ..., MC8, but an example embodiment thereof is not limited thereto.

The string select transistor SST may be connected to the corresponding string select lines SSL1, SSL2, and SSL3. The plurality of memory cells MC1, MC2, ..., MC8 may be respectively connected to corresponding gate lines GTL1, GTL2, ..., GTL8. The gate lines GTL1, GTL2, ..., GTL8 may correspond to word lines, and a portion of the gate lines GTL1, GTL2, ..., GTL8 may correspond to dummy word lines. The ground select transistor GST may be connected to the corresponding ground select lines GSL1, GSL2, and GSL3. The string select transistor SST may be connected to the corresponding bit lines BL1, BL2, and BL3, and the ground select transistor GST may be connected to the common source line CSL.

The word line (e.g., WL1) disposed on the same level may be connected in common, and the ground select lines GSL1, GSL2, GSL3 and the string select lines SSL1, SSL2, SSL3 may be separated from each other. In FIG. 4, the memory block BLK may be connected to eight gate lines GTL1, GTL2, ..., GTL8 and three bit lines BL1, BL2, BL3, but an example embodiment thereof is not limited thereto.

FIGS. 7A to 7D are cross-sectional diagrams illustrating a nonvolatile memory device according to an example embodiment.

The nonvolatile memory device 200 according to the example embodiments illustrated in FIGS. 7A to 7D may correspond to the structure of the nonvolatile memory device 100 illustrated in FIG. 2. However, differently from the nonvolatile memory device 100 illustrated in FIG. 2, the page buffer PB included in the nonvolatile memory device 200 in an example embodiment may be distinguished from other circuits included in the peripheral circuit region PERI.

For example, referring to FIGS. 7A to 7D, the nonvolatile memory device 200 may include a memory cell region CELL including a first semiconductor substrate 201 and a plurality of memory cells disposed on the first semiconductor substrate 201, and a peripheral circuit region PERI disposed below the memory cell region CELL and including a second semiconductor substrate 251 and peripheral circuits disposed on the second semiconductor substrate 251 and controlling a plurality of memory cells.

First and second horizontal conductive layers 202 and 203 may be disposed on the first semiconductor substrate 201, and the first semiconductor substrate 201 may be defined by the gate electrodes 205 and the insulating layers 206 alternately stacked, and channel structures CH penetrating through the insulating layers 206 and connected to the first semiconductor substrate 201.

The gate electrodes 205 may be connected to the gate contacts 208 through exposed ends, and the memory cell region CELL may include a first cell region insulating layer 240*a* stacked to cover the gate electrodes 105, an upper protective layer 245, and a second cell region insulating layer 240*b*.

In the nonvolatile memory device 200 in an example embodiment, the memory cell region CELL may be connected to the peripheral circuit region PERI by a connection portion 209 included in the through region TR and penetrating through the sacrificial insulating layers 207, the insulating layers 206, and the substrate insulating layer 204. The connection portion 209 may be electrically connected to the lower wiring structures 260 disposed on one surface of the lower protective layer 295 by being recessed into at least a portion of the peripheral region insulating layer 290.

The peripheral circuits included in the peripheral circuit region PERI may include a page buffer PB, a row decoder XDEC, and other peripheral circuits OC. The page buffer PB may include a plurality of vertical transistors defined by a source region, a channel region, and a drain region stacked in sequence in the first direction (e.g., the Z-direction).

The page buffer PB may be preferentially connected to a connection portion of the memory cell to sense a value of the memory cell. That is, a connection distance between the page buffer PB and the plurality of memory cells may be less than a connection distance between the other circuits included in the peripheral circuit region PERI and the plurality of memory cells. For example, the page buffer PB may be included in a page buffer block disposed below the memory cell region CELL, and may be connected to the memory cell region CELL in the through region TR.

Figure 7A:
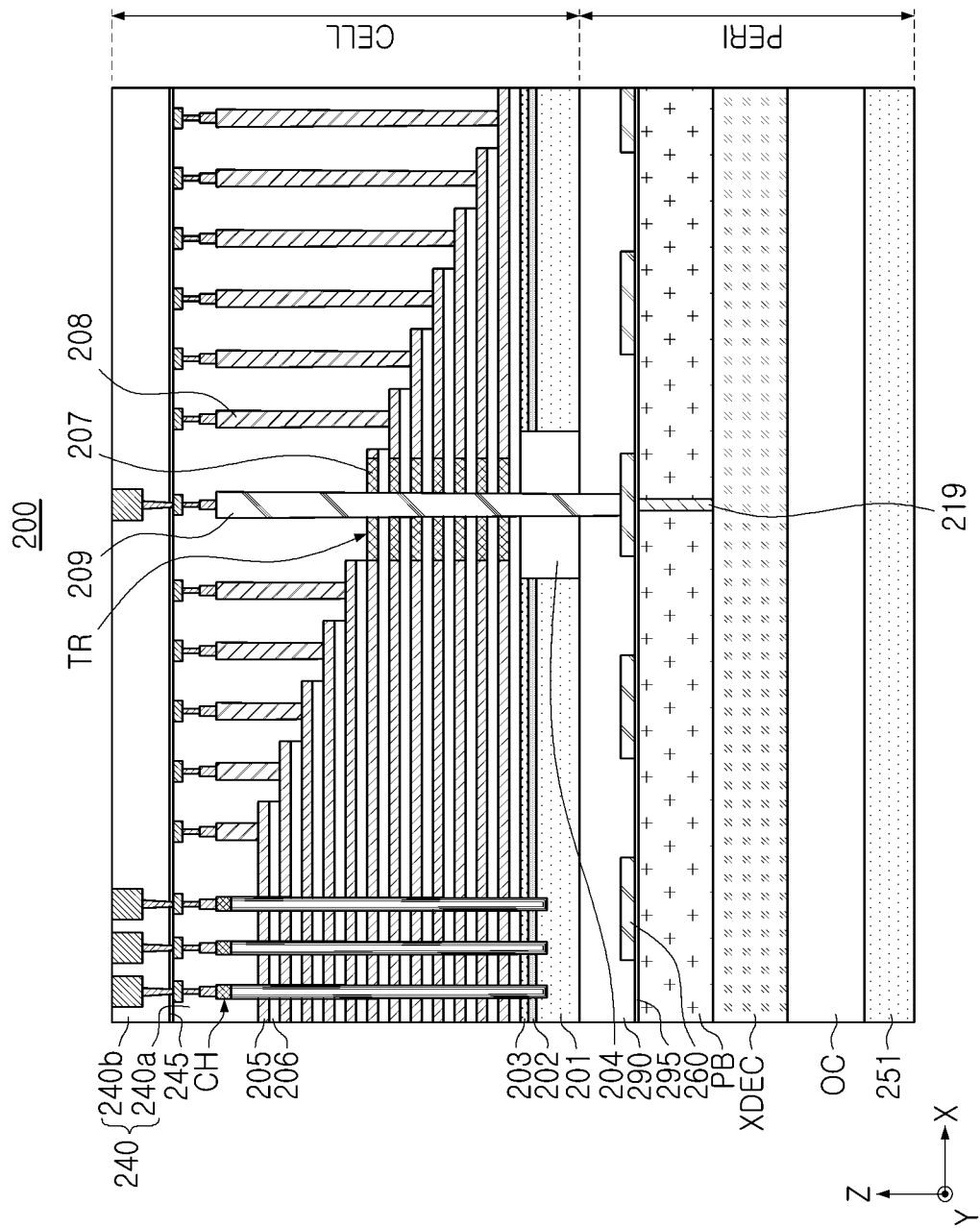
FIGS. 7A to 7E are cross-sectional diagrams illustrating a nonvolatile memory device according to an example embodiment of the present disclosure.

Referring to FIG. 7A, in the nonvolatile memory device 200 in an example embodiment, a peripheral circuit block may be disposed below the page buffer block including the page buffer PB. The peripheral circuit block may include the row decoder XDEC and other peripheral circuits OC disposed below the row decoder XDEC. The row decoder XDEC may be connected to a via 219 penetrating through the page buffer block to receive a control signal through the connection portion 209.

In this case, the row decoder XDEC and other peripheral circuits OC included in the peripheral circuit block may include vertical transistors defined by a source region, a channel region, and a drain region stacked in sequence in the first direction, similarly to the page buffer PB. The other peripheral circuits OC may receive a command CMD, an address ADDR, and a control CTRL signal, and may exchange data with an external host.

Figure 7B:
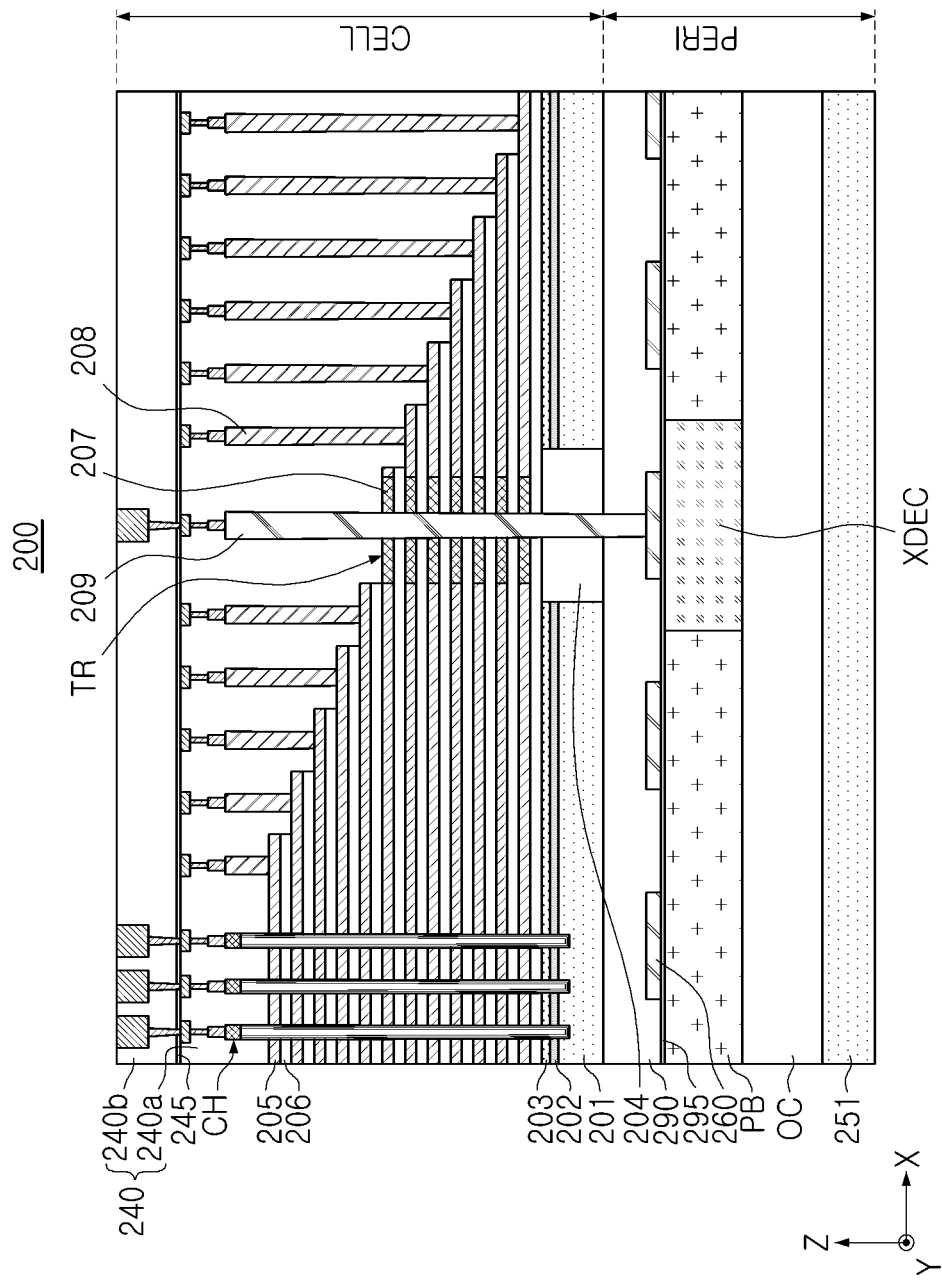

Referring to FIG. 7B, in the nonvolatile memory device 200 in an example embodiment, the page buffer block including the page buffer PB may include the row decoder XDEC. A peripheral circuit block including other peripheral circuits OC may be disposed below the page buffer block. The row decoder XDEC may be connected to the connector 209 through the lower wiring structures 260 in the first direction (e.g., the Z-direction). The row decoder XDEC and the other peripheral circuits OC may include vertical transistors defined by a source region, a channel region, and a drain region stacked in sequence in the first direction, similarly to the page buffer PB.

Figure 7C:
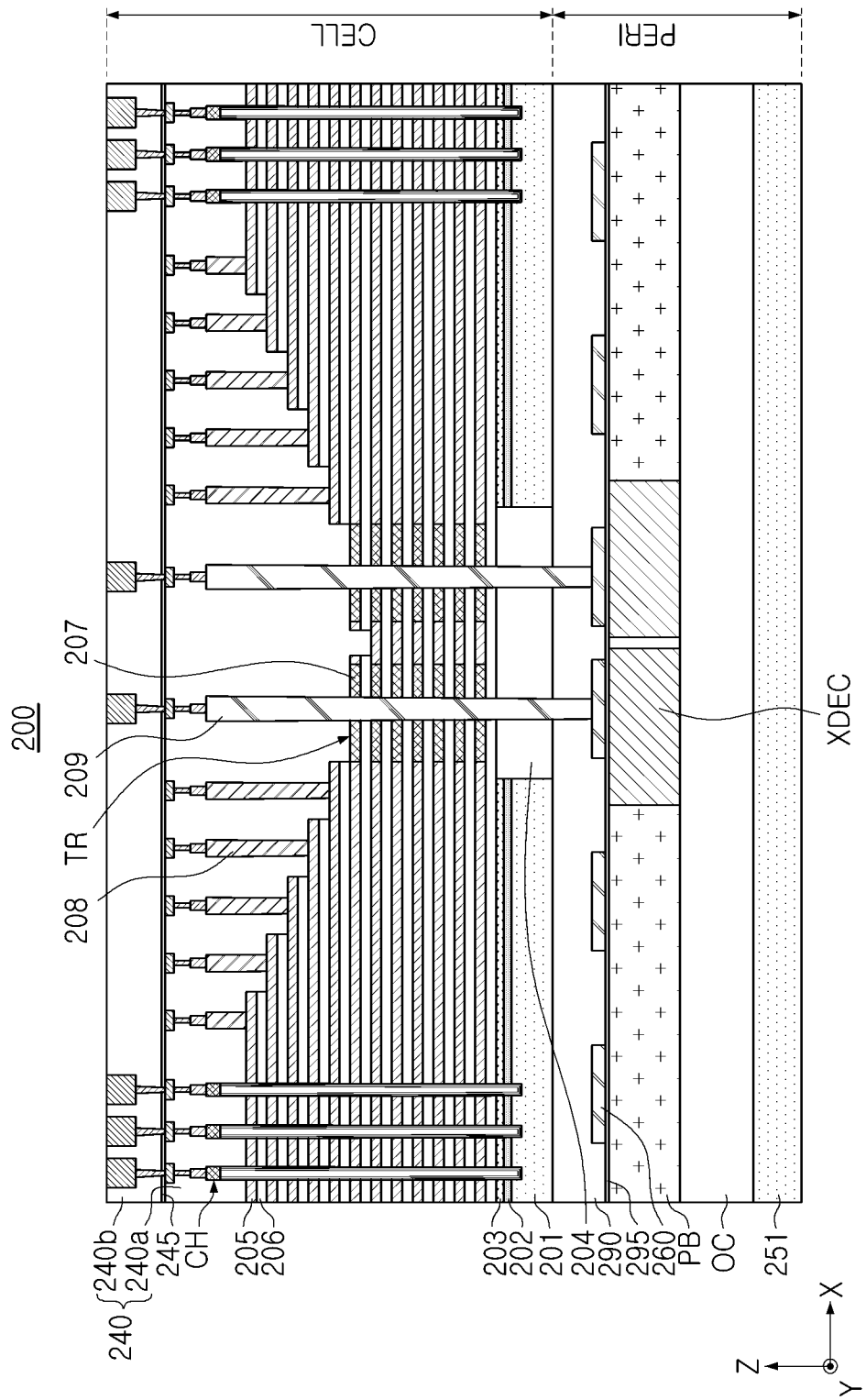
Figure 7D:
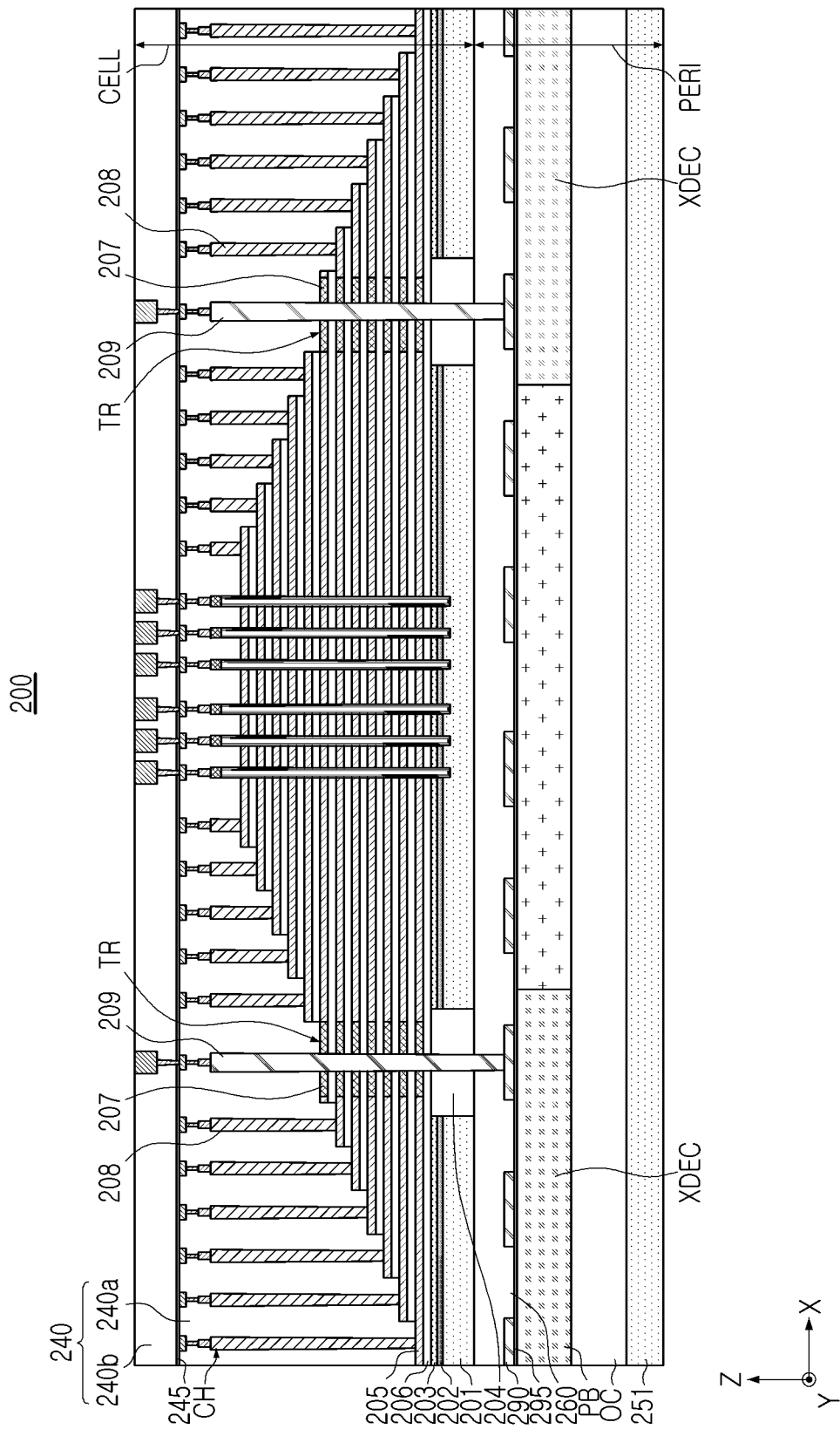

Referring to FIGS. 7C and 7D, the nonvolatile memory device 200 in an example embodiment may include a page buffer block including a page buffer PB and a row decoder XDEC, and a peripheral circuit block including other peripheral circuits OC and disposed below the page buffer block. In this case, the row decoder XDEC may be disposed in a center of the peripheral circuit region PERI or in a periphery of the peripheral circuit region PERI. The structure of the memory cell region may be varied depending on the position of the row decoder XDEC.

For example, when the row decoder XDEC is disposed in the center of the peripheral circuit region PERI as illustrated in FIG. 7C, the connection portion 209 connected to the row decoder XDEC may be disposed in the center of the memory cell region CELL. Accordingly, the plurality of memory cells may be formed on both sides of the connection portion 209, and the page buffer PB may be disposed below the plurality of memory cells.

As illustrated in FIG. 7D, when the row decoder XDEC is disposed on a periphery of the peripheral circuit region PERI, the connection portion 209 connected to the row decoder XDEC may be disposed on a periphery of the memory cell region CELL. Accordingly, a plurality of memory cells may be formed between the connection portions 209, and a page buffer PB may be disposed below the plurality of memory cells.

Figure 7E:
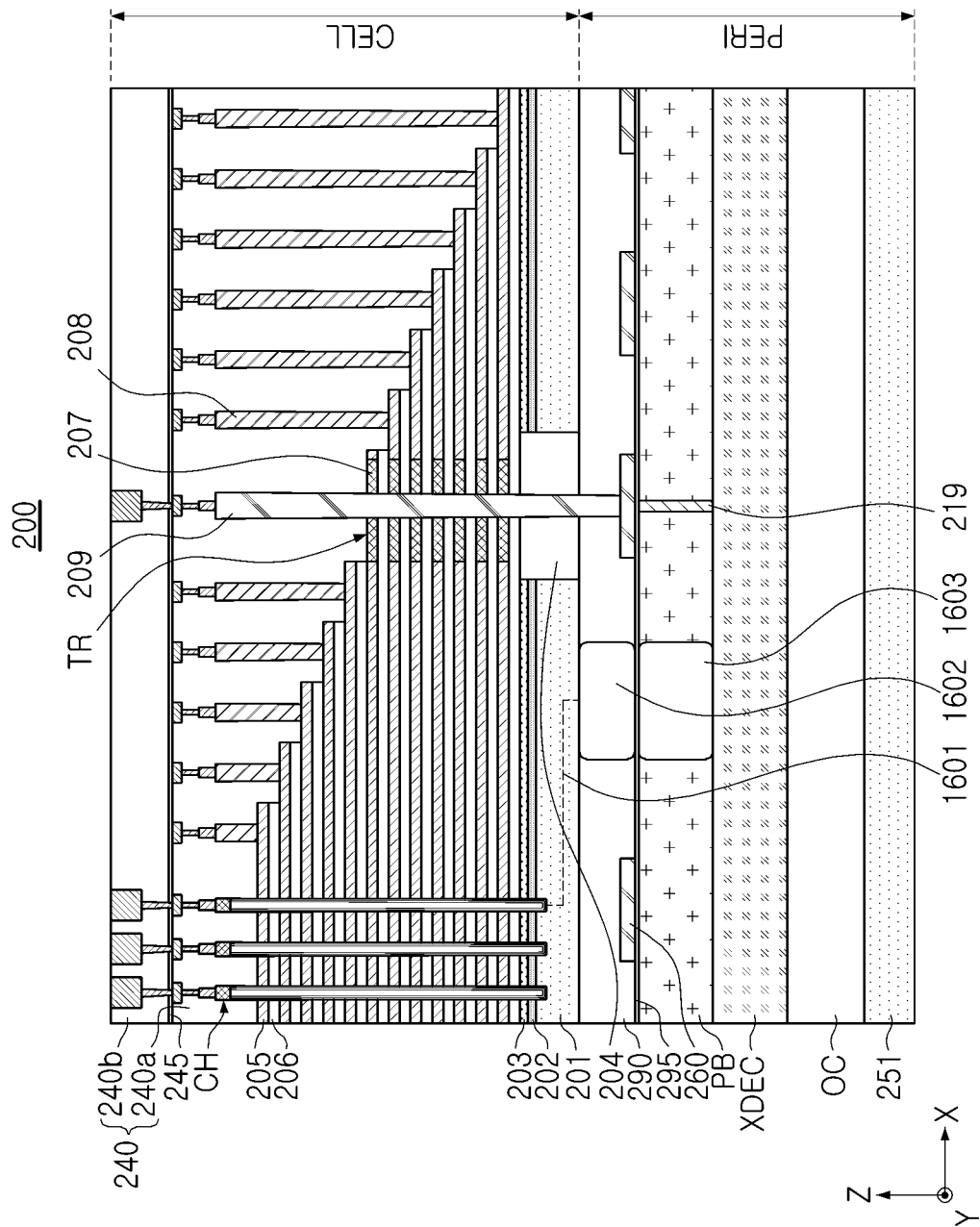

FIG. 7E illustrates an exemplary embodiment illustrating the location of vertically stacked transistors in the page buffer PB. Those Item numbers in FIG. 7E repeated from item numbers of FIG. 7A have the same meaning as in FIG. 7A and redundant description is omitted in FIG. 7E. Item 1601 of FIG. 7E indicates the electrical connection from an exemplary channel CH to interconnect 1602 (shown as a dashed line, this may be, for example, a bit line). Interconnect 1602 connects channel CH with latch circuit 1603. Latch circuit 1603 includes vertically stacked transistors as illustrated in FIGS. 3A and 3B. In an embodiment, latch circuit 1603 is implemented using the structures of FIG. 3C. Interconnect is also provided to read out latch values and to control the latch (not shown).

FIGS. 8, 9, 10A, 10B, 11, and 12 are cross-sectional diagrams illustrating a nonvolatile memory device according to an example embodiment.

Nonvolatile memory devices 300, 400, 500, 600, and 700 illustrated in FIGS. 8, 9, 10A, 10B, 11, and 12 according to an example embodiment may correspond to the structure of the nonvolatile memory device 100 illustrated in FIG. 2.

For example, referring to FIG. 8, the nonvolatile memory device 300 may include a memory cell region CELL including a plurality of memory cells disposed on a first semiconductor substrate 301, and a peripheral circuit region PERI disposed below the memory cell region CELL and including peripheral circuits disposed on the second semiconductor substrate 351 and controlling a plurality of memory cells. First and second horizontal conductive layers 302 and 303 may be disposed on the semiconductor substrate 301. The memory cell region CELL may include a first cell region insulating layer 340*a* stacked to cover the gate electrodes 305, an upper protective layer 345, and a second cell region insulating layer 340*b*. The connection portion 309 may be electrically connected to the lower wiring structures 360 disposed on one surface of the lower protective layer 395 by being recessed into at least a portion of the peripheral region insulating layer 390.

The plurality of memory cells may be defined by the gate electrodes 305 and the insulating layers 306, and channel structures CH penetrating through the gate electrodes 305 and the insulating layers 306 and connected to the first semiconductor substrate 301.

The peripheral circuits included in the peripheral circuit region PERI may include a page buffer PB, a row decoder XDEC, and other peripheral circuits OC. The page buffer PB may include a plurality of vertical transistors defined by a source region, a channel region, and a drain region stacked in sequence in the first direction (e.g., the Z-direction).

The above-described configurations of the nonvolatile memory device 300 may also be applied to the other nonvolatile memory devices 400, 500, 600, and 700 illustrated in FIGS. 9 to 12. However, differently from the nonvolatile memory device 100 illustrated in FIG. 2, the page buffer PB included in each of the nonvolatile memory devices 300, 400, 500, 600 and 700 in an example embodiment may be distinguished from the other circuits included in the peripheral circuit region PERI in the first direction.

Figure 8:
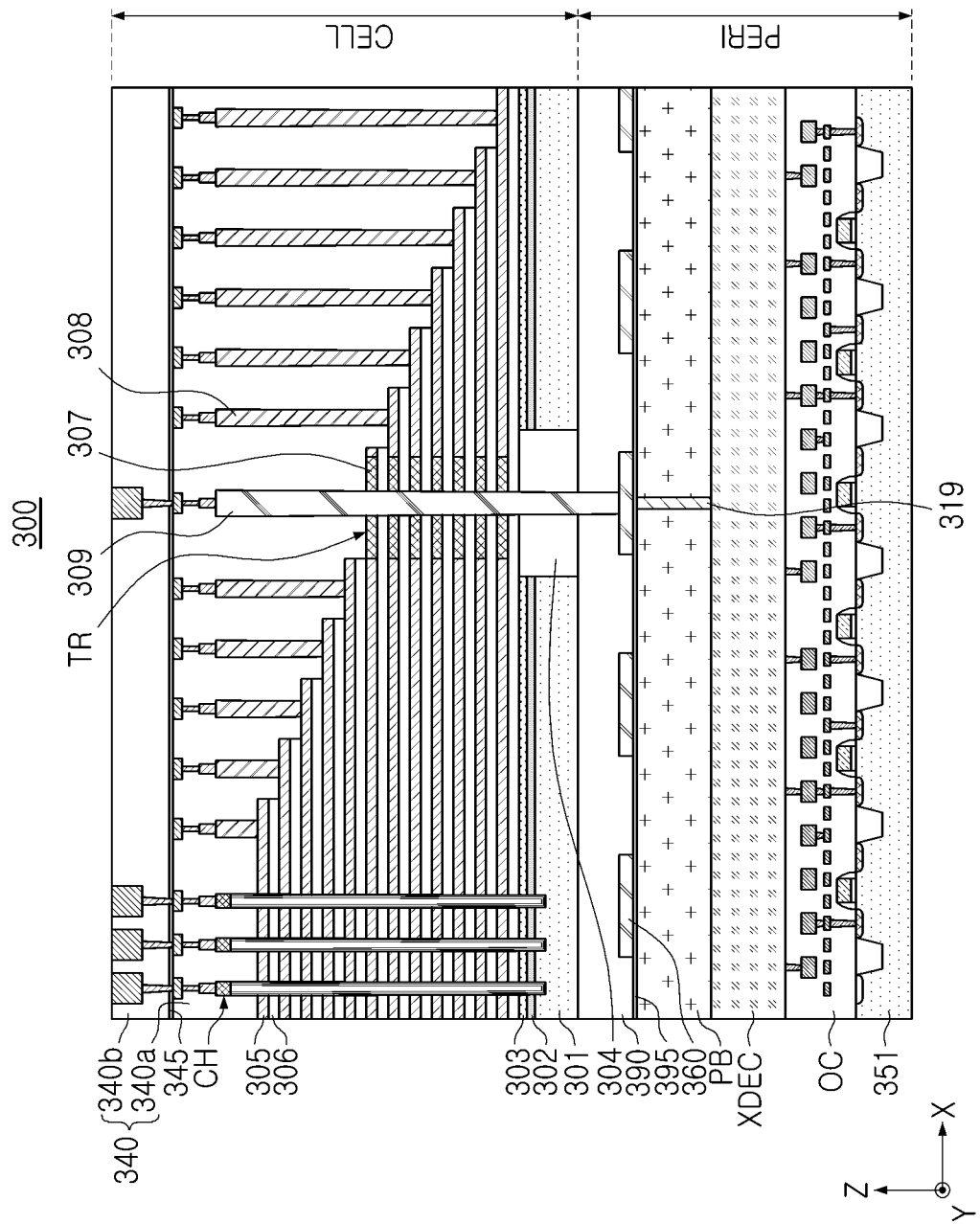
FIGS. 8, 9, 10A, 10B, 11, and 12 are cross-sectional diagrams illustrating a nonvolatile memory device according to an example embodiment of the present disclosure.

Referring to FIG. 8, in the nonvolatile memory device 300 in an example embodiment, a peripheral circuit block may be disposed below the page buffer block including the page buffer PB. The peripheral circuit block may include the row decoder XDEC and other peripheral circuits OC disposed below the row decoder XDEC. The row decoder XDEC may be connected to a via 319 penetrating through the page buffer block to receive a control signal through the connection portion 309. Gate contacts 308 and sacrificial insulating layers 307 are also shown.

In this case, the row decoder XDEC included in the peripheral circuit block may include vertical transistors defined by a source region, a channel region, and a drain region stacked in sequence in the first direction, similarly to the page buffer PB. However, the other peripheral circuits OC may include horizontal transistors defined by a source region, a channel region, and a drain region formed in the second direction (e.g., the X-direction) on the second semiconductor substrate 351.

Figure 9:
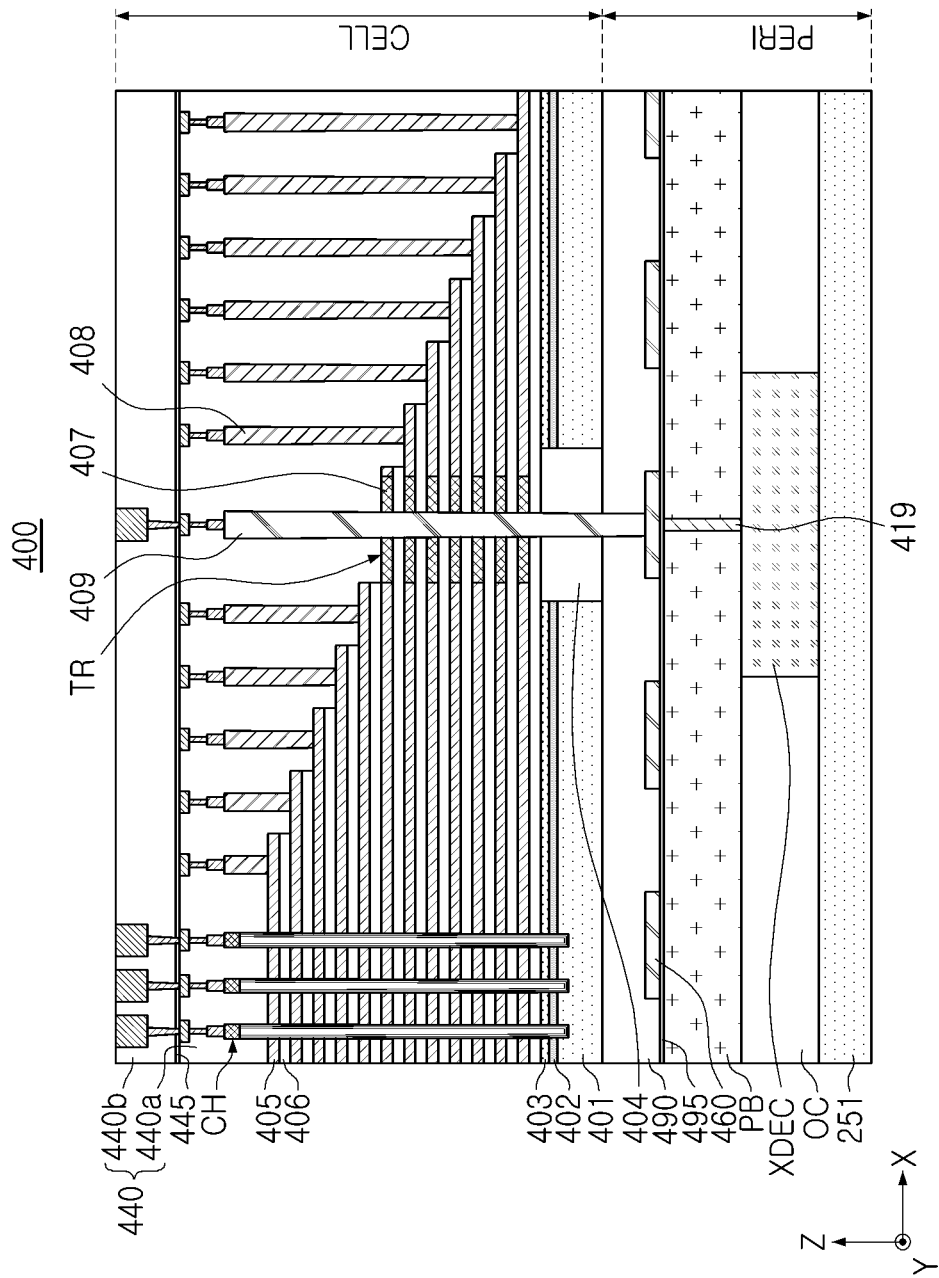

Referring to FIG. 9, since the size of the page buffer PB may be greatly affected by an increase in storage capacity of the nonvolatile memory device 400, the page buffer PB may be arranged in the widest region. Accordingly, in the nonvolatile memory device 400 in an example embodiment, a peripheral circuit block may be disposed below the page buffer block including the page buffer PB, and the row decoder XDEC and other peripheral circuits OC may be formed in a block disposed on the same level. That is, the row decoder XDEC may be disposed on a side surface of the other peripheral circuits OC, and the row decoder XDEC may be connected to a via 419 penetrating through the page buffer block to receive a control signal through the connection portion 409. As the nonvolatile memory device 400 forms the peripheral circuit block as a layer, an overall height of the nonvolatile memory device 400 may be reduced as compared to that of the nonvolatile memory device 300 in FIG. 8.

First and second horizontal conductive layers 402 and 403 may be disposed on the semiconductor substrate 401. The memory cell region CELL may include a first cell region insulating layer 440a stacked to cover the gate electrodes 405, an upper protective layer 445, and a second cell region insulating layer 440b. The connection portion 409 may be electrically connected to the lower wiring structures 460 disposed on one surface of the lower protective layer 495 by being recessed into at least a portion of the peripheral region insulating layer 490. Gate contacts 408 and sacrificial insulating layers 407 are also shown.

Figure 10A:
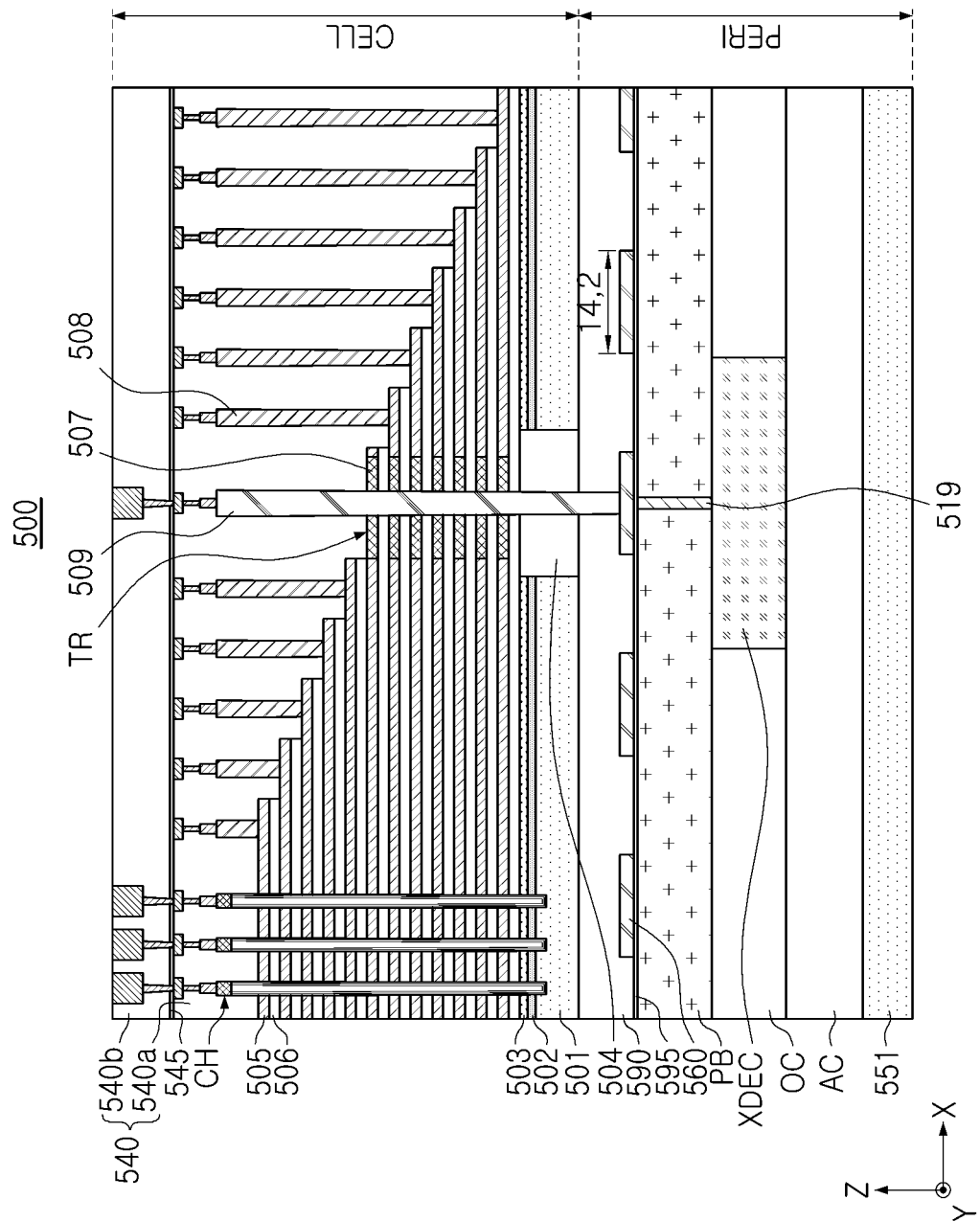
Figure 10B:
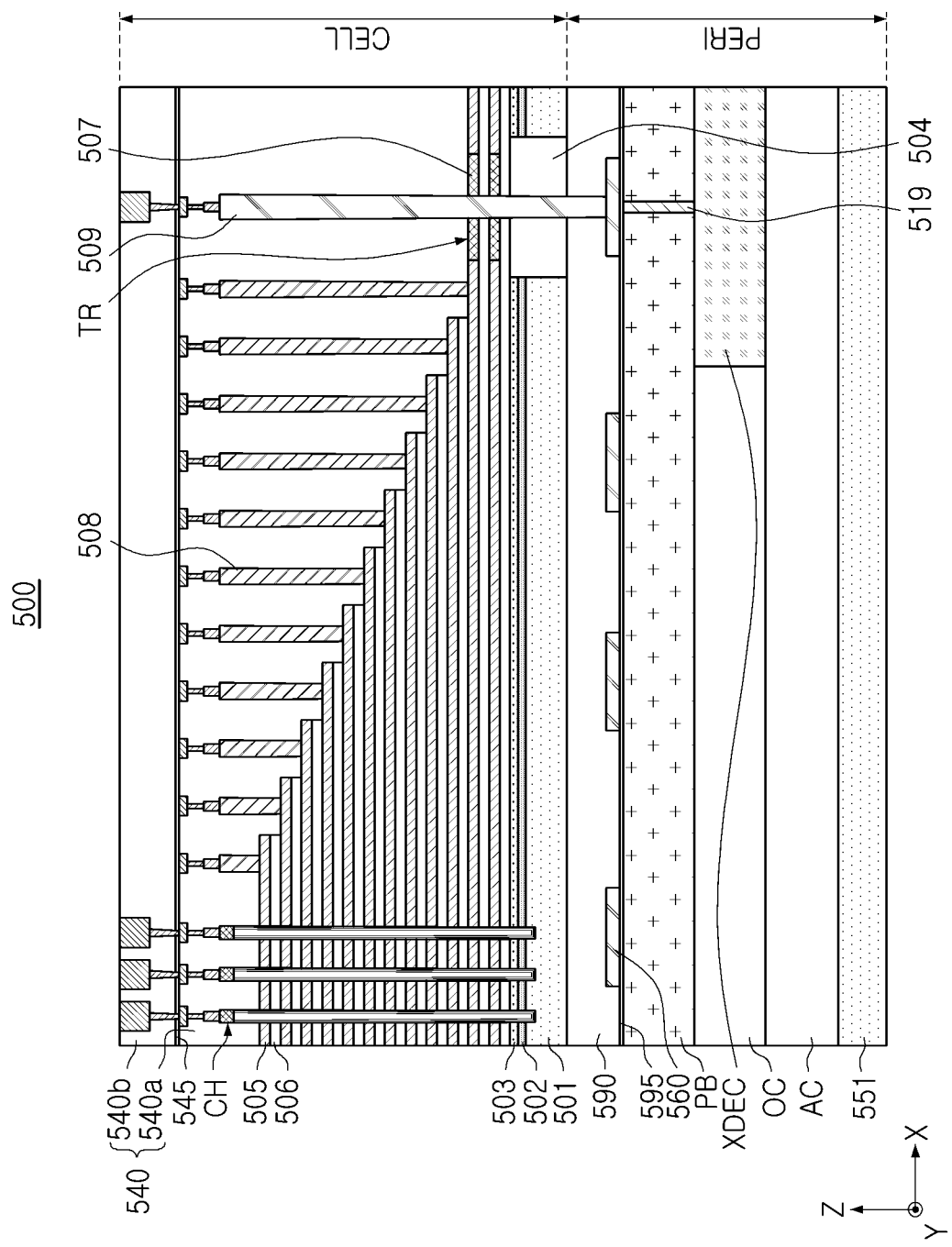
Figure 11:
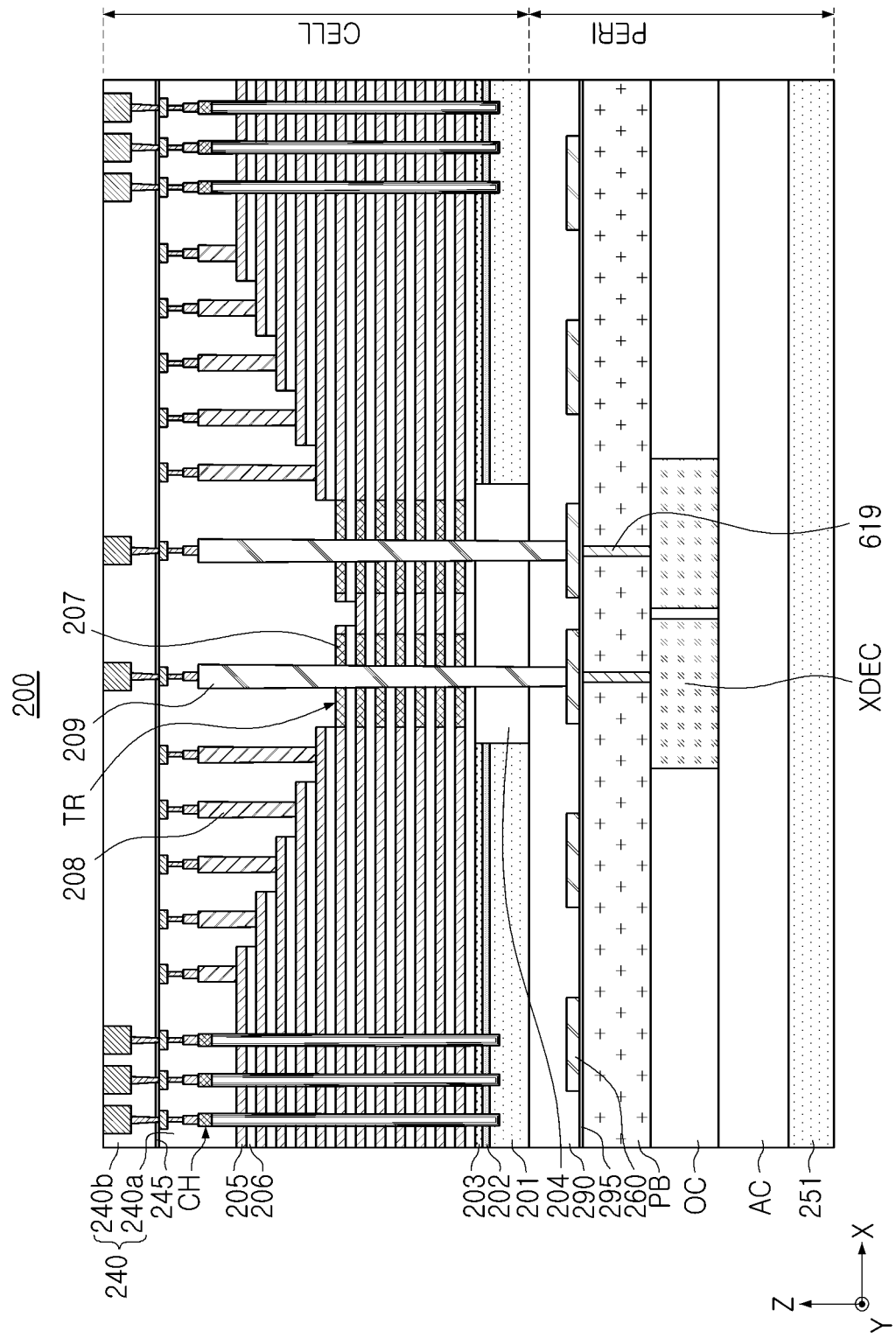
Figure 12:
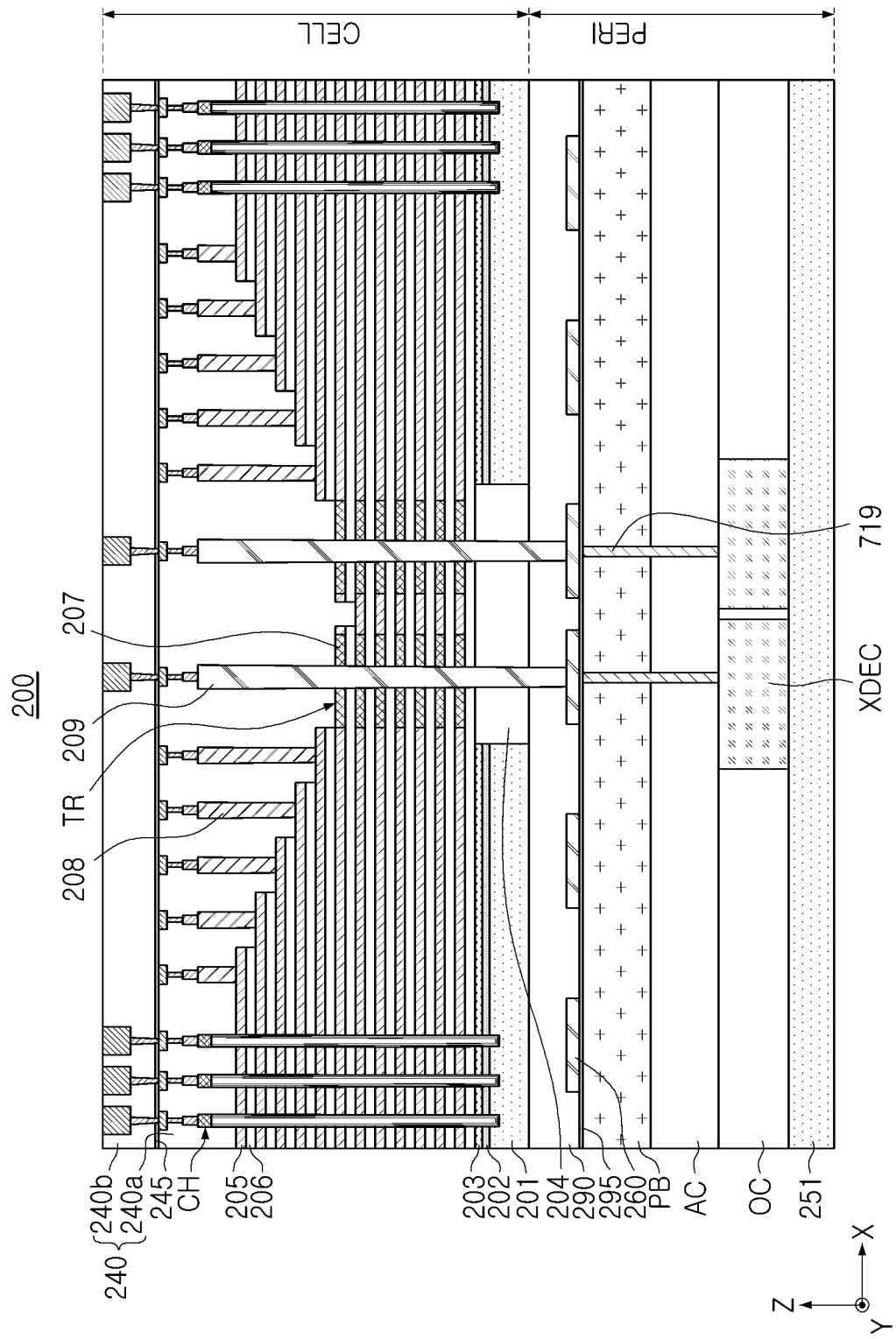

Referring to FIGS. 10A, 10B, 11, and 12, in the nonvolatile memory devices 500, 600, and 700 in an example embodiment, the peripheral circuit region PERI may include peripheral circuit block disposed below the page buffer block including the page buffer PB, and may further include an additional circuit block disposed on or below the peripheral circuit block including the row decoder XDEC and other peripheral circuits OC. For example, referring to FIGS. 10A, 10B, and 11, the nonvolatile memory devices 500 and 600 may further include an additional circuit block disposed below the peripheral circuit block. In this case, the row decoder XDEC may be connected to the connectors 509 and 609 through vias 519 and 619 penetrating through the page buffer block. Referring to FIG. 12, the nonvolatile memory device 700 may further include an additional circuit block disposed above the peripheral circuit block. In this case, the row decoder XDEC may be connected to the connector 709 through a via 719 penetrating through the page buffer block and the additional circuit block.

In FIGS. 10A and 10B, first and second horizontal conductive layers 502 and 503 may be disposed on the semiconductor substrate 501. The memory cell region CELL may include a first cell region insulating layer 540a stacked to cover the gate electrodes 505, an upper protective layer 545, and a second cell region insulating layer 540b. The connection portion 509 may be electrically connected to the lower wiring structures 560 disposed on one surface of the lower protective layer 595 by being recessed into at least a portion of the peripheral region insulating layer 590. Gate contacts 508 and sacrificial insulating layers 507 are also shown.

In FIG. 11, first and second horizontal conductive layers 602 and 603 may be disposed on the semiconductor substrate 601. The memory cell region CELL may include a first cell region insulating layer 640a stacked to cover the gate electrodes 605, an upper protective layer 645, and a second cell region insulating layer 640b. The connection portion 609 may be electrically connected to the lower wiring structures 660 disposed on one surface of the lower protective layer 695 by being recessed into at least a portion of the peripheral region insulating layer 690. Gate contacts 608 and sacrificial insulating layers 607 are also shown.

In FIG. 12, first and second horizontal conductive layers 702 and 703 may be disposed on the semiconductor substrate 701. The memory cell region CELL may include a first cell region insulating layer 740a stacked to cover the gate electrodes 705, an upper protective layer 745, and a second cell region insulating layer 740b. The connection portion 709 may be electrically connected to the lower wiring structures 760 disposed on one surface of the lower protective layer 795 by being recessed into at least a portion of the peripheral region insulating layer 790. Gate contacts 708 and sacrificial insulating layers 707 are also shown.

The additional circuit block may include additional circuit (AC), such as an artificial intelligence (AI) functional circuit and/or an error correction code (ECC) functional circuit. However, an example embodiment thereof is not limited thereto, and the additional circuit included in the additional circuit block may be configured to perform various functions.

The nonvolatile memory devices 500, 600, and 700 in an example embodiment are not limited by area and may perform new functions by additionally arranging additional circuit blocks in the peripheral circuit region PERI. In particular, a function performed by the memory controller may be performed by the peripheral circuit region PERI, such that performance of the nonvolatile memory devices 500, 600, and 700 may improve.

Referring to FIGS. 10A and 10B, in the nonvolatile memory device 500 in an example embodiment, the additional circuit AC included in the additional circuit block may be configured as a circuit performing a computation of an error correction code (ECC) with respect to the value stored in the page buffer PB. The additional circuit AC may be disposed more adjacent to the input/output terminal than the page buffer PB and may perform a function of error detection and correction for read data.

More specifically, the additional circuit AC may generate parity bits for write data to be written to the nonvolatile memory device 500, and the generated parity bits may be stored together with the write data. During a data read operation in the nonvolatile memory device 500, the additional circuit AC may correct an error in the read data using parity bits read together with the read data and may output the error-corrected read data.

The structure of the nonvolatile memory device 500 may be varied in example embodiments. For example, referring to FIG. 10A, a connection portion 509 connected to the row decoder XDEC through a via 519 penetrating through the page buffer block may be disposed between the channel structures CH in which a plurality of memory cells are formed. Accordingly, the row decoder XDEC may be formed below the plurality of memory cells.

Referring to FIG. 10B, the connection portion 509 connected to the row decoder XDEC through the via 519 penetrating through the page buffer block may be disposed on one side of the channel structure CH in which a plurality of memory cells are formed. Although not illustrated in FIG. 10B, pad structures may be disposed on one side of the connection portion 509. However, an example embodiment thereof is not limited thereto. Accordingly, the row decoder XDEC may be formed on a periphery of the peripheral circuit region PERI.

Referring to FIG. 11, the peripheral circuit region PERI of the nonvolatile memory device 600 in an example embodiment may include additional circuit blocks, peripheral circuit blocks, and page buffer blocks, stacked in sequence. In this case, the row decoder XDEC included in the peripheral circuit block may be disposed in a center of the peripheral circuit block. Accordingly, the row decoder XDEC may be disposed to be surrounded by other peripheral circuits OC, and at least one connection portion 609 may be disposed on the row decoder XDEC. A plurality of memory cells may be formed on both sides of the connection portion 609.

Referring to FIG. 12, the peripheral circuit region PERI of the nonvolatile memory device 700 in an example embodiment may include peripheral circuit blocks, additional circuit blocks, and page buffer blocks, stacked in sequence. That is, in the nonvolatile memory device 700, the additional circuit block may be disposed between the peripheral circuit block and the page buffer block.

The additional circuit AC included in the additional circuit block may be a circuit performing a multiply and accumulate (MAC) operation on a value stored in the page buffer PB. The additional circuit AC may be configured to apply artificial intelligence technology to the storage device including the nonvolatile memory device 700, and since the additional circuit AC may directly calculate a value from the page buffer PB, the additional circuit AC may be disposed adjacent to the page buffer PB.

Figure 13A:
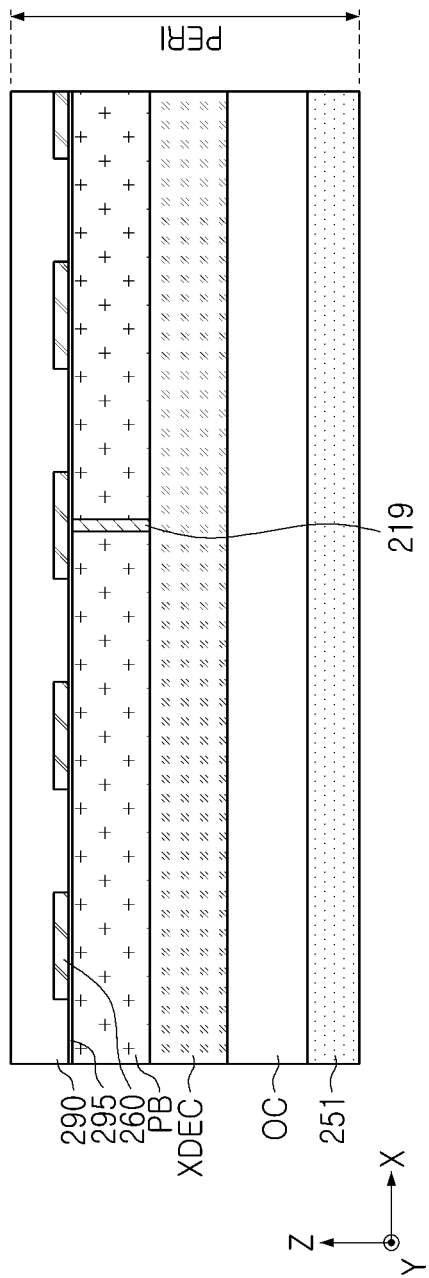
FIGS. 13A to 13C are diagrams illustrating processes of manufacturing a nonvolatile memory device according to an example embodiment of the present disclosure.
Figure 13B:
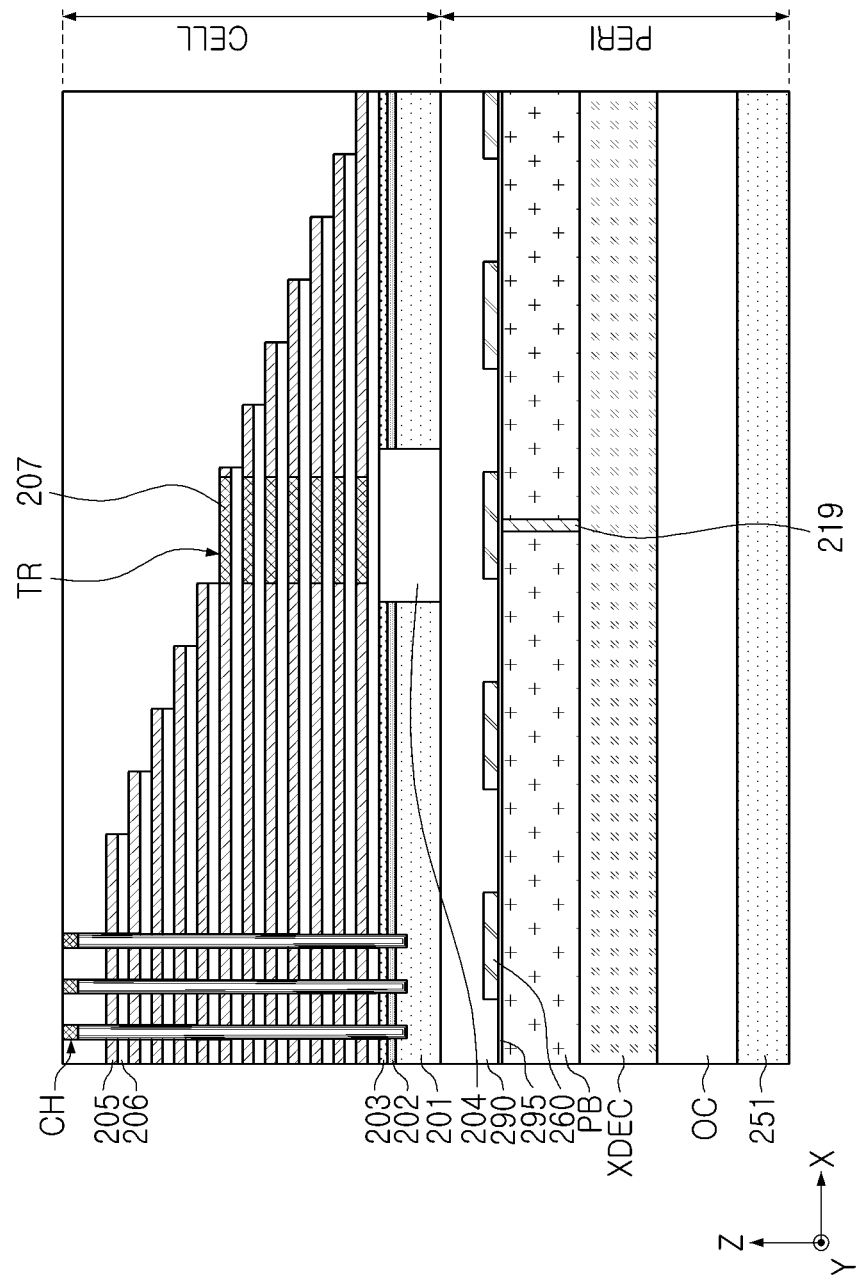
Figure 13C:
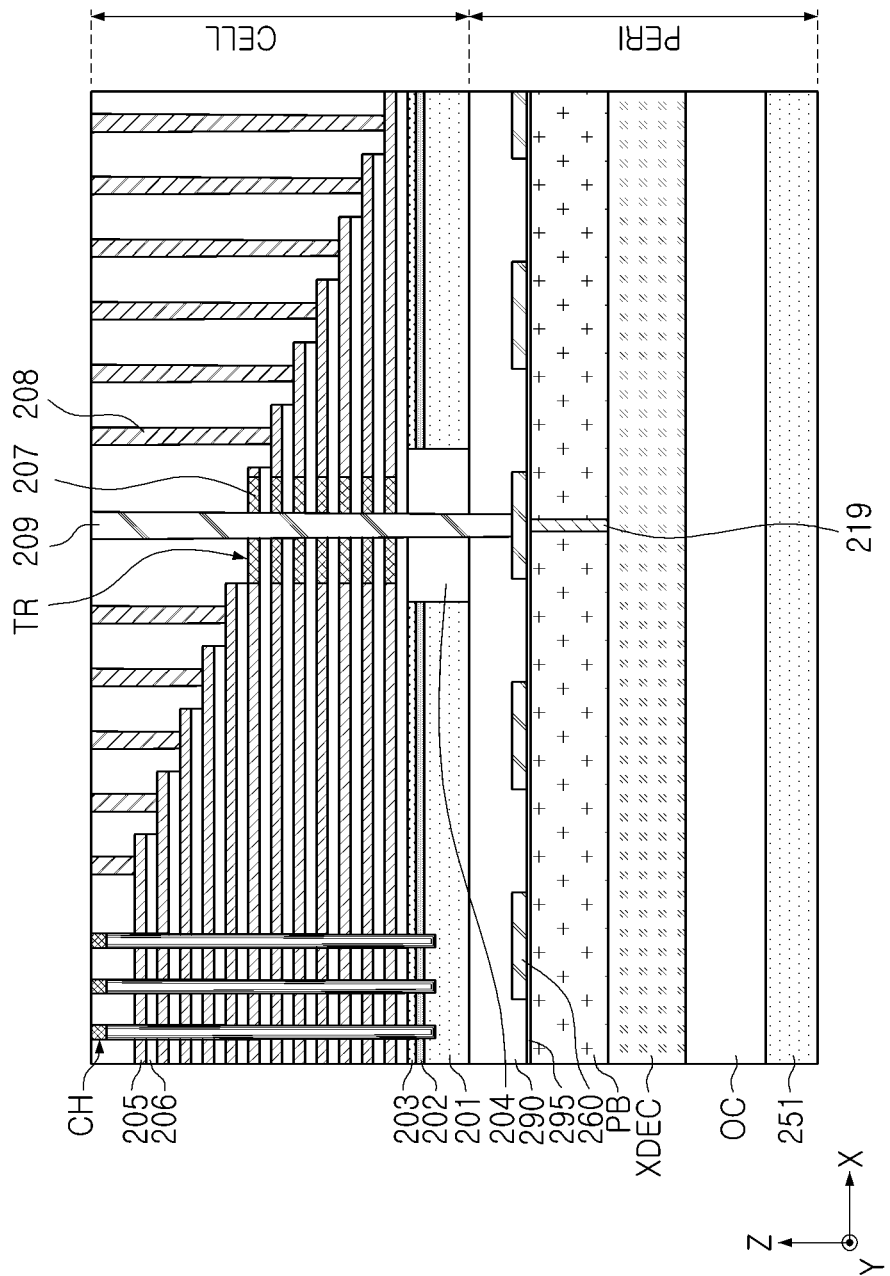

FIGS. 13A to 13C are diagrams illustrating processes of manufacturing a nonvolatile memory device according to an example embodiment.

FIGS. 13A to 13C may be diagrams illustrating processes of manufacturing the nonvolatile memory device 200 illustrated in FIG. 7A. The manufacturing process in FIGS. 13A to 13C may be similarly applied to the nonvolatile memory devices 100, 300, 400, 500, 600 and 700 in the other example embodiments. However, an example embodiment thereof is not limited thereto.

Referring to FIG. 13A, a peripheral circuit region PERI including a page buffer PB, a row decoder XDEC, and other peripheral circuits OC may be formed on the second semiconductor substrate 251. A lower passivation layer 295 may be formed on the page buffer block including the page buffer PB, and the page buffer PB may be electrically connected to the lower wiring structure 260 disposed on one surface of the lower passivation layer 295. A peripheral region insulating layer 290 covering the lower wiring structure 260 may be formed on the lower passivation layer 295.

In this case, the page buffer PB may include a plurality of vertical transistors defined by a source region, a channel region, and a drain region stacked in sequence in the first direction (e.g., the Z-direction). At least a portion of the row decoder XDEC and other peripheral circuits OC may also include a plurality of vertical transistors.

Referring to FIGS. 13B and 13C, on the first semiconductor substrate 201 disposed on the peripheral circuit region PERI, a memory cell region CELL including gate electrodes 230 and channel structures CH may be formed. A first semiconductor substrate 201 including a substrate insulating layer 204 may be disposed on the peripheral region insulating layer 290.

First and second horizontal conductive layers 202 and 203 may be disposed on the first semiconductor substrate 201, and gate electrodes 205 and insulating layers 206 may be alternately stacked. Sacrificial insulating layers 207 may be formed on a portion overlapping at least a portion of the substrate insulating layer 204 in the first direction (e.g., the Z-direction) in a portion in which the gate electrodes 205 extend. The substrate insulating layer 204, the insulating layers 206, and the sacrificial insulating layers 207 stacked in the first direction may form the through region TR.

After the channel structures CH penetrating through the gate electrodes 205 and the insulating layers 206 are formed, gate contacts 208 connected to exposed ends of the gate electrodes 205, and a connection portion 209 electrically connecting the memory cell region CELL to the peripheral circuit region PERI may be formed in the memory cell region CELL. The connection portion 209 may be connected to the row decoder XDEC disposed below the page buffer block through a via 219 penetrating through the page buffer block. The nonvolatile memory device 200 illustrated in FIG. 7A may be manufactured through the processes described above.

Figure 14A:
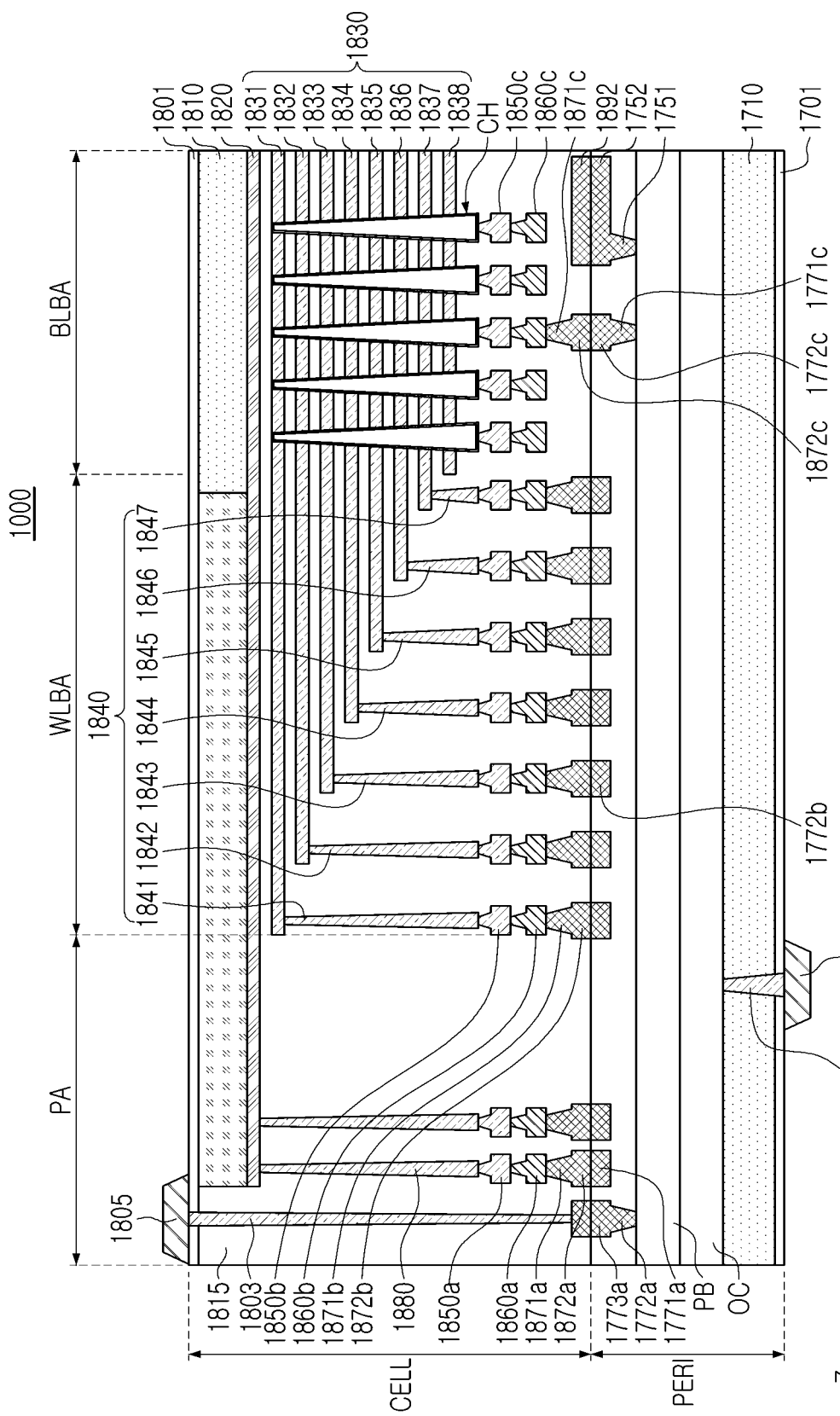
FIGS. 14A to 14C are cross-sectional diagrams illustrating a nonvolatile memory device according to an example embodiment of the present disclosure.
Figure 14B:
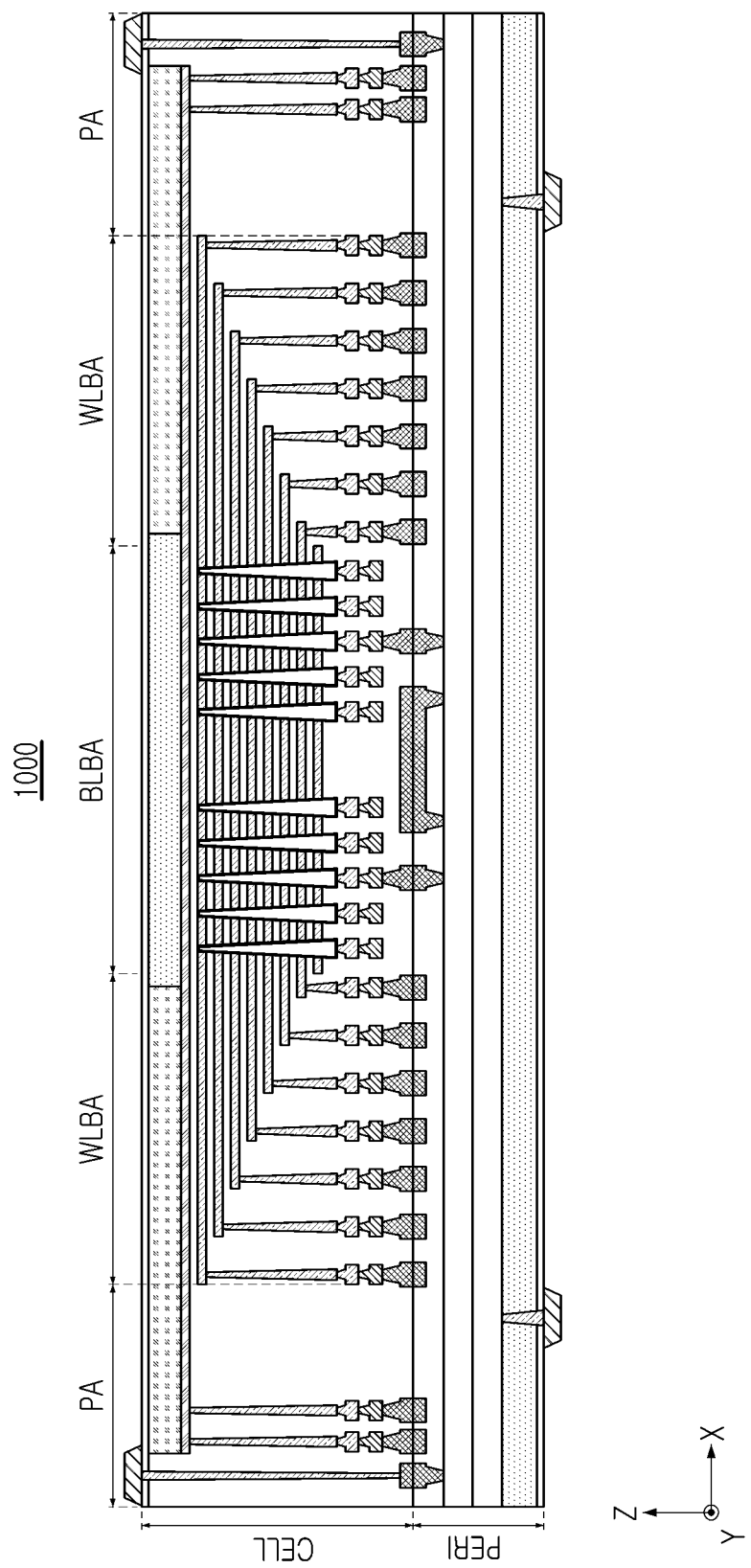
Figure 14C:
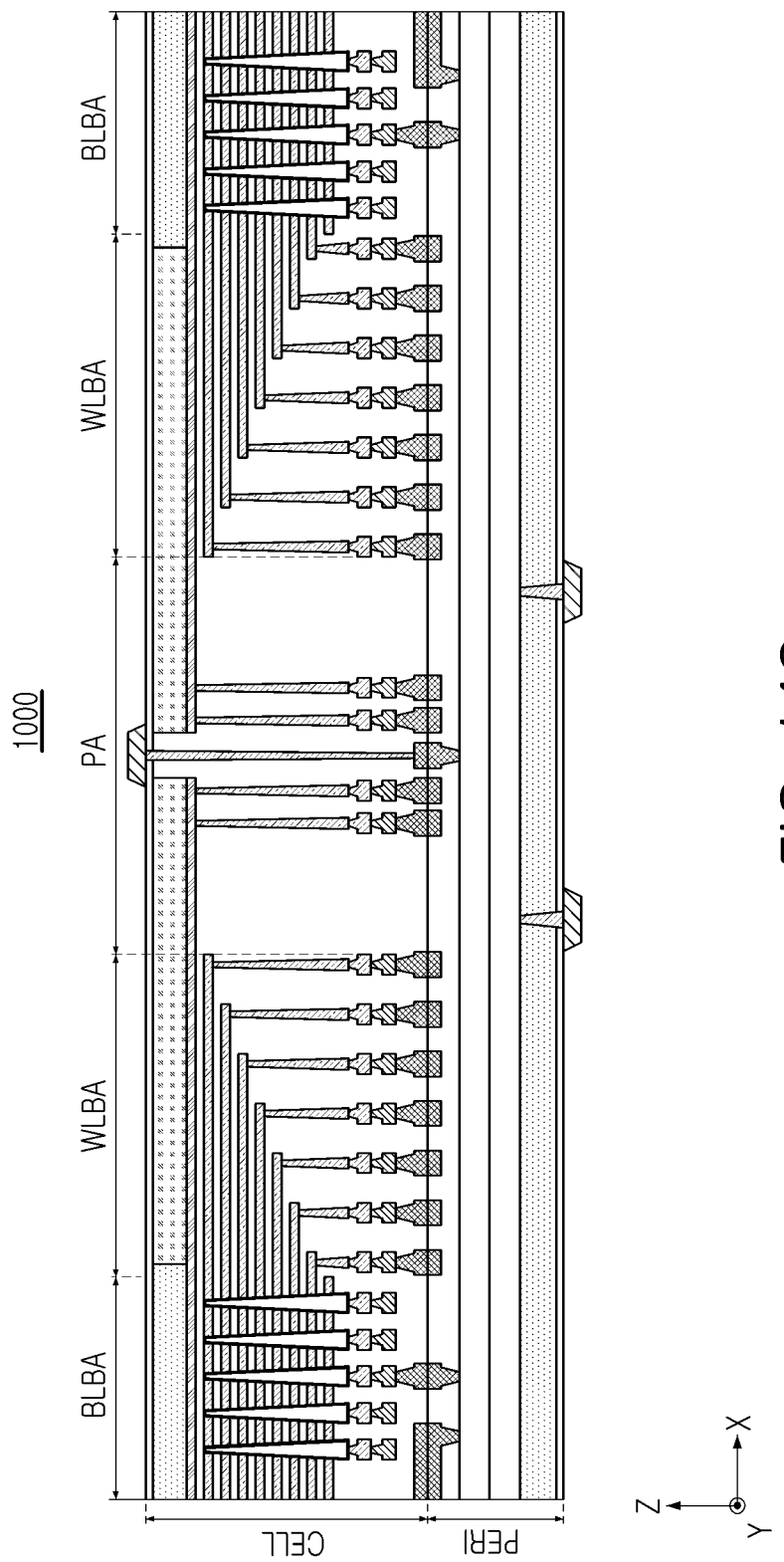

FIGS. 14A to 14C are cross-sectional diagrams illustrating a nonvolatile memory device according to an example embodiment.

Referring to FIG. 14A, the nonvolatile memory device 1000 in an example embodiment may be manufactured to have a chip to chip (C2C) structure using a wafer bonding method. In the C2C structure, an upper chip including a memory cell region CELL may be formed on a first semiconductor substrate 1810, a lower chip including a peripheral circuit region PERI may be formed on the second semiconductor substrate 1710 different from the first semiconductor substrate 1810, and the upper chip and the lower chip may be connected to each other by a bonding method. For example, the bonding method may refer to a method of electrically connecting a bonding metal formed in an uppermost metal layer of the upper chip, that is, for example, a first metal pad to a bonding metal formed on an uppermost metal layer of the lower chip, that is, for example, a second metal pad. For example, when the bonding metal is formed of copper (Cu), the bonding method may be a Cu-to-Cu bonding method, and the bonding metal may be formed of aluminum (Al) or tungsten (W).

The nonvolatile memory device 1000 in an example embodiment may include semiconductor structures having a structure stacked in a first direction (e.g., a Z-direction). The first semiconductor structure disposed on the first semiconductor substrate 1810 of the nonvolatile memory device 1000 may correspond to the memory cell region CELL, and the second semiconductor structure disposed on the second semiconductor substrate 1710 may correspond to the peripheral circuit region PERI.

By a wafer bonding method, a direct connection path having a short connection length may be formed between the memory cell region CELL and the peripheral circuit region PERI. Accordingly, by using the wafer bonding method, delay due to a chip interface may be removed, power consumption may be reduced, and an input/output speed of data and control signals may improve.

Each of the peripheral circuit region PERI and the cell region CELL of the nonvolatile memory device 1000 may include an external pad bonding region PA, a word line bonding region WLBA, and a bit line bonding region BLBA.

The peripheral circuit region PERI may include a second semiconductor substrate 1710 and peripheral circuits formed on the second semiconductor substrate 1710. In the nonvolatile memory device 1000 in an example embodiment, peripheral circuits may be formed on a plurality of metal layers and may be implemented as vertical transistors. For example, the page buffer PB performing a sensing operation on the plurality of memory cells may include a plurality of vertical transistors defined by a source region, a channel region, and a drain region stacked in sequence in a first direction perpendicular to the upper surface of the first semiconductor substrate 1810.

In this case, a page buffer block including the page buffer PB may be formed on an uppermost portion of the peripheral circuit region. That is, the page buffer block may be disposed between the first semiconductor substrate 1810 and other peripheral circuits OC.

A lower bonding metal 1772*b* may be formed on the page buffer block of the word line bonding region WLBA. In the word line bonding region WLBA, the lower bonding metal 1772*b* of the peripheral circuit region PERI may be electrically connected to the upper bonding metals 1871*b* and 1872*b* of the cell region CELL by a bonding method, and the bonding metal 1772*b* and the upper bonding metals 1871*b* and 1872*b* may be formed of aluminum, copper, tungsten, or the like.

The memory cell region CELL may provide at least one memory block. The memory cell region CELL may include a first semiconductor substrate 1810 and a common source line 1820. A plurality of word lines 1831-1838 (1830) may be stacked on the first semiconductor substrate 1810 in a first direction (e.g., Z-direction) perpendicular to the upper surface of the first semiconductor substrate 1810. String select lines and a ground select line may be disposed above and below the word lines 1830, respectively, and a plurality of word lines 1830 may be disposed between the string select lines and the ground select line.

In the bit line bonding region BLBA, the channel structures CH may extend in a direction (Z-axis direction) perpendicular to the upper surface of the first semiconductor substrate 1810 may penetrate the word lines 1830, string select lines, and a ground select line. The channel structures CH may include a data storage layer, a channel layer, and an embedded insulating layer, and the channel layer may be electrically connected to the first metal layer 1850*c* and the second metal layer 1860*c*. For example, the first metal layer 1850*c* may be a bit line contact, and the second metal layer 1860*c* may be a bit line. In an example embodiment, the bit line 1860*c* may extend in a third direction (e.g., Y-direction) parallel to the upper surface of the first semiconductor substrate 1810.

In the example embodiment illustrated in FIG. 14A, a region in which the channel structures CH and the bit line 1860*c* are disposed may be defined as the bit line bonding region BLBA. The bit line 1860*c* may be electrically connected to circuit devices providing the page buffer PB in the peripheral circuit region PERI in the bit line bonding region BLBA. For example, the bit line 1860*c* may be connected to the upper bonding metals 1871*c* and 1872*c* in the peripheral circuit region PERI, and the upper bonding metals 1871*c* and 1872*c* may be connected to the lower bonding metals 1771*c* and 1772*c* connected to the circuit devices 1720*c* of the page buffer 1893.

In the word line bonding region WLBA, the word lines 1830 may extend in a second direction (e.g., X-direction) perpendicular to the third direction and parallel to the upper surface of the first semiconductor substrate 1810, and may be connected to a plurality of cell contact plugs 1841-1847 (1840). The word lines 1830 and the cell contact plugs 1840 may be connected to each other through pads provided by at least a portion of the word lines 1830 extending by different lengths in the second direction. A first metal layer 1850*b* and a second metal layer 1860*b* may be connected in sequence to the cell contact plugs 1840 connected to the word lines 1830. The cell contact plugs 1840 may be connected to the peripheral circuit region PERI through the upper bonding metal 1871*b* and 1872*b* of the cell region CELL and the lower bonding metal 1772*b* of the peripheral circuit region PERI.

The cell contact plugs 1840 may be electrically connected to circuit devices forming the row decoder XDEC in the peripheral circuit region PERI. In an example embodiment, operating voltages of circuit devices forming the row decoder XDEC may be different from operating voltages of circuit devices forming the page buffer PB. For example, operating voltages of circuit devices forming the page buffer PB may be greater than operating voltages of circuit devices forming the row decoder XDEC.

A common source line contact plug 1880 may be disposed in the external pad bonding region PA. The common source line contact plug 1880 may be formed of a metal, a metal compound, or a conductive material such as polysilicon, and may be electrically connected to the common source line 1820. A first metal layer 1850*a* and a second metal layer 1860*a* may be stacked in sequence on the common source line contact plug 1880. For example, a region in which the common source line contact plug 1880, the first metal layer 1850*a*, and the second metal layer 1860*a* are disposed may be defined as an external pad bonding region PA.

Meanwhile, input/output pads 1705 and 1805 may be disposed in the external pad bonding region PA. Referring to FIG. 14A, a lower insulating film 1701 covering the lower surface of the second semiconductor substrate 1710 may be formed below the second semiconductor substrate 1710, and a second input/output pad 1705 may be formed on the lower insulating film 1701. The second input/output pad 1705 may be connected to at least one of a plurality of circuit devices disposed in the peripheral circuit region PERI through a second input/output contact plug 1703, and may be separated from the second semiconductor substrate 1710 by a lower insulating layer 1701. Also, a side insulating layer may be disposed between the second input/output contact plug 1703 and the second semiconductor substrate 1710 and may electrically separate the second input/output contact plug 1703 from the second semiconductor substrate 1710.

Referring to FIG. 14A, an upper insulating layer 1801 covering the upper surface of the first semiconductor substrate 1810 may be formed on the first semiconductor substrate 1810, and the first insulating layer 1801 may be formed on the upper insulating layer 1801. An input/output pad 1805 may be connected to at least one of the plurality of circuit devices 1720a, 1720b, and 1720c disposed in the peripheral circuit region PERI through the first input/output contact plug 1803. In an example embodiment, the first input/output pad 1805 may be electrically connected to the circuit device 1720a.

In example embodiments, the first semiconductor substrate 1810 and the common source line 1820 may not be disposed in the region in which the first input/output contact plug 1803 is disposed. Also, the first input/output pad 1805 may not overlap the word lines 1880 in the first direction (e.g., the Z-direction). Referring to FIG. 5, the first input/output contact plug 1803 may be separated from the first semiconductor substrate 1810 in a direction parallel to the upper surface of the first semiconductor substrate 1810, may penetrate the interlayer insulating layer 1815 of the cell region CELL, and may be connected to the first input/output pad 1805.

In example embodiments, the second input/output pad 1705 and the first input/output pad 1805 may be selectively formed. For example, the nonvolatile memory device 1000 may include only the second input/output pad 1705 disposed on the lower insulating layer 1701, or may include only the first input/output pad 1805 disposed on the upper insulating layer 1801. Alternatively, the nonvolatile memory device 1000 may include both the second input/output pad 1705 and the first input/output pad 1805.

In each of the external pad bonding region PA and the bit line bonding region BLBA included in the memory cell region CELL and the peripheral circuit region PERI, the metal pattern of the uppermost metal layer may be present as a dummy pattern, or the uppermost metal layer may be empty.

The nonvolatile memory device 1000 may form a lower metal pattern 1771a having the same shape as a shape of the upper metal pattern 1872a of the memory cell region CELL on an uppermost metal of the peripheral circuit region PERI to correspond to the upper metal pattern 1872a formed on an uppermost metal layer of the memory cell region CELL in the external pad bonding region PA. The lower metal pattern 1771a formed on the uppermost metal layer of the peripheral circuit region PERI may not be connected to a contact in the peripheral circuit region PERI. Similarly, an upper metal pattern 1872a having the same shape as that of the lower metal pattern 1773a may be formed on an upper metal layer of the cell region CELL to correspond to the lower metal pattern 1773a formed on the uppermost metal layer of the peripheral circuit region PERI in the external pad bonding region PA.

A lower bonding metal 1772b may be formed on the page buffer block of the word line bonding region WLBA. In the word line bonding region WLBA, the lower bonding metal 1772b of the peripheral circuit region PERI may be electrically connected to the upper bonding metals 1871b and 1872b of the memory cell region CELL by a bonding method.

Also, an upper metal pattern 1892 having the same shape as that of the lower metal pattern 1752 of the peripheral circuit region PERI may be formed on the uppermost metal layer of the cell region CELL corresponding to the lower metal pattern 1752 formed in the uppermost metal layer of the peripheral circuit region PERI in the bit line bonding region BLBA. A contact may not be formed on the upper metal pattern 1892 formed on the uppermost metal layer of the memory cell region CELL.

In the nonvolatile memory device 1000 in an example embodiment, a row decoder XDEC may be formed in a partial region of the first semiconductor substrate 1810. The row decoder XDEC may be formed in the word line bonding region WLBA and the external pad bonding region PA. The row decoder XDEC may operate to select a word line by receiving a control signal through at least one contact plug.

However, the nonvolatile memory device 1000 illustrated in FIG. 14A may be merely an example with respect to the wafer bonding method, and the structure of the nonvolatile memory device 1000 according to the wafer bonding method is limited to the example illustrated in FIG. 14A. For example, the row decoder XDEC may be formed on the first semiconductor substrate 1810, but alternatively, the row decoder XDEC may be formed on the second semiconductor substrate 1710.

Referring to FIG. 14B, in the nonvolatile memory device 1000, the row decoder XDEC may be formed on a periphery thereof. In this case, the center of the nonvolatile memory device 1000 may correspond to the bit line bonding region BLBA. Referring to FIG. 14C, the row decoder XDEC may be formed in the center of the nonvolatile memory device 1000. In this case, the center of the nonvolatile memory device 1000 may correspond to the external pad bonding region PA.

Figure 15:
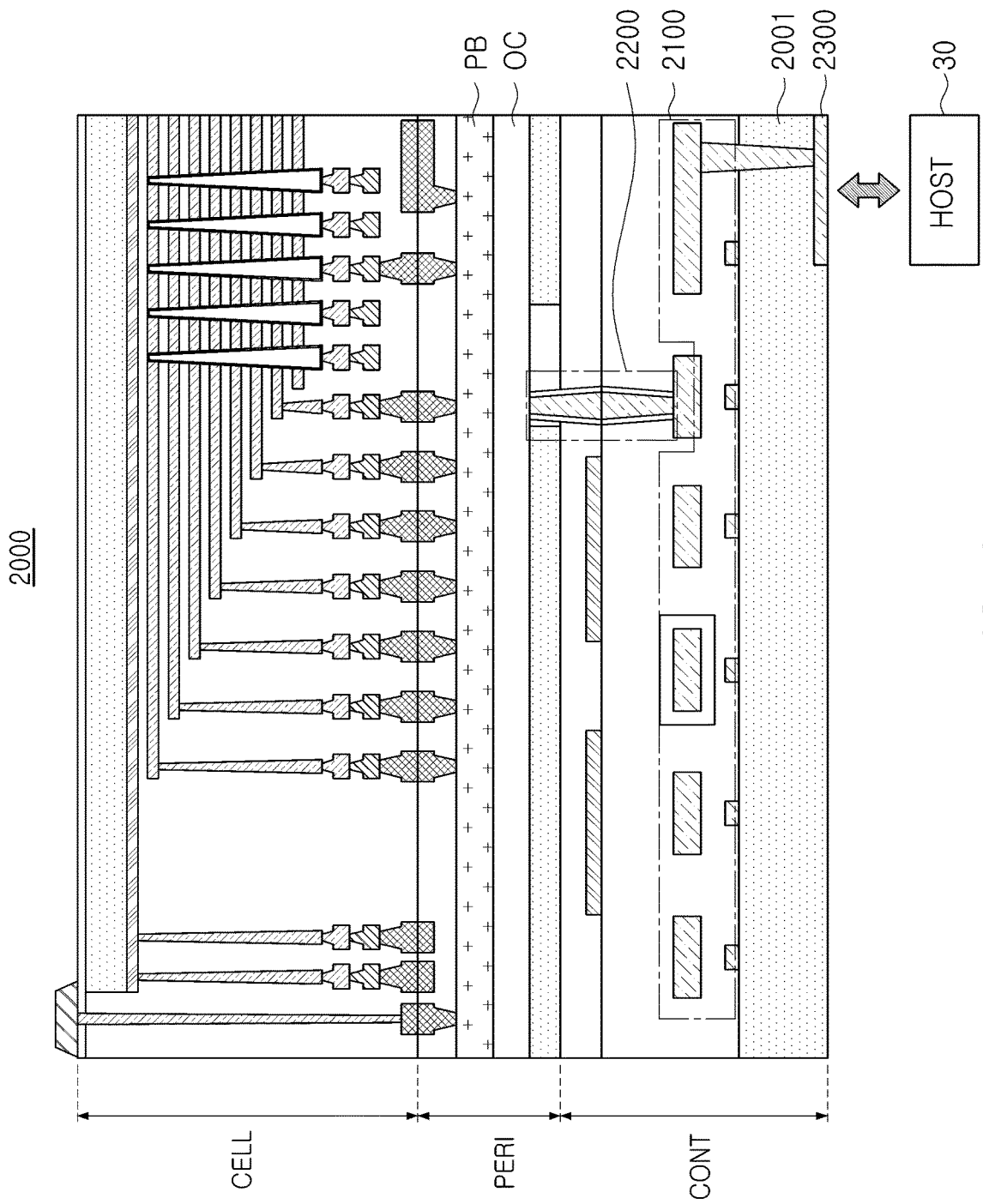
FIG. 15 is a cross-sectional diagram illustrating a storage device according to an example embodiment of the present disclosure.

FIG. 15 is a cross-sectional diagram illustrating a storage device according to an example embodiment.

In the storage device 2000 in an example embodiment illustrated in FIG. 15, a third semiconductor structure CONT including a memory controller 2100 may be coupled to the nonvolatile memory device 1000 illustrated in FIG. 14A by a 3-stack structure. That is, the page buffer PB included in the storage device 2000 may include vertical transistors.

The third semiconductor structure CONT may include a third semiconductor substrate 2001, a memory controller 2100 formed on the third semiconductor substrate 2001, and a connection structure 2200.

For example, the memory controller 2100 may transmit signals to and receive signals from the nonvolatile memory device 1000 electrically connected through the connection structure 2200 based on a signal applied from a host 30. The memory controller 2100 may control overall operation of the nonvolatile memory device 1000 based on signals exchanged with the nonvolatile memory device 1000.

A third metal pad 2300 may be disposed on a lower surface of the third semiconductor substrate 2001. The third metal pad 2300 may be electrically connected to the memory controller 2100 through a connection via penetrating through the third semiconductor substrate 2001.

The memory controller 2100 may receive a control command from the host 30 through the third metal pad 2300 and may exchange data therewith. The memory controller 2100 may convert the control command transmitted from the host 30 into a control signal and may transmit the control signal to the nonvolatile memory device 1000.

Similarly to the wafer bonding method, the connection structure 2200 may form a direct connection path having a short connection length between the nonvolatile memory device 1000 and the memory controller 2100. Accordingly, the connection structure 2200 may eliminate delay due to the chip interface, may reduce power consumption, and may improve the input/output speed of data and control signals.

In the storage device 2000 in an example embodiment, by vertically stacking the nonvolatile memory device 1000 including a memory cell region CELL and a peripheral circuit region PERI, and the memory controller 2100, the chip size may be reduced and the components may be directly connected to each other.

According to the aforementioned example embodiments, the nonvolatile memory device may, by implementing the page buffer included in the peripheral circuit region using vertical transistors, use the space to the maximum.

While the example embodiments have been illustrated and described above, it will be apparent to those skilled in the art that modifications and variations could be made without departing from the scope of the present disclosure as defined by the appended claims.

What is claimed is:

1. A nonvolatile memory device, comprising:
a memory cell region comprising a first semiconductor substrate and a plurality of memory cells disposed on the first semiconductor substrate, the plurality of memory cells being defined by gate electrodes stacked and spaced apart from each other and channel structures penetrating through the gate electrodes and connected to the first semiconductor substrate; and
a peripheral circuit region disposed below the memory cell region, the peripheral circuit region comprising a second semiconductor substrate and peripheral circuits disposed on the second semiconductor substrate and controlling the plurality of memory cells, the peripheral circuits comprising a page buffer, a row decoder, and other peripheral circuits,
wherein the page buffer is in a page buffer block disposed on a lower surface of the first semiconductor substrate to be distinguished from other circuits in the peripheral circuit region in a first direction perpendicular to an upper surface of the first semiconductor substrate, is connected to the memory cell region through a connection portion penetrating through the first semiconductor substrate, and the page buffer comprises a plurality of vertical transistors each defined by a source region, a channel region, and a drain region stacked in sequence in the first direction.

2. The nonvolatile memory device of claim 1, wherein a first distance between the page buffer and the plurality of memory cells is less than a second distance between the other circuits in the peripheral circuit region and the plurality of memory cells.

3. The nonvolatile memory device of claim 1, wherein a peripheral circuit block is disposed below the page buffer block, and the peripheral circuit block comprises the row decoder and the other peripheral circuits disposed below the row decoder.

4. The nonvolatile memory device of claim 3, wherein a first plurality of transistors in the peripheral circuit block are each defined by a second source region, a second channel region, and a second drain region stacked in sequence in the first direction.

5. The nonvolatile memory device of claim 3, wherein a second plurality of transistors in the row decoder are each defined by a third source region, a third channel region, and a third drain region stacked in sequence in the first direction, and a third plurality of transistors in the other peripheral circuits are each defined by a fourth source region, a fourth channel region, and a fourth drain region formed on the second semiconductor substrate and arranged in a second direction, perpendicular to the first direction.

6. The nonvolatile memory device of claim 1, wherein a peripheral circuit block is disposed below the page buffer block, and the peripheral circuit block comprises the row decoder and the other peripheral circuits disposed on a side surface of the row decoder.

7. The nonvolatile memory device of claim 6, wherein the peripheral circuit region further comprises an additional circuit block disposed below the peripheral circuit block, and the additional circuit block performs an operation of an error correction code (ECC) on a value stored in the page buffer.

8. The nonvolatile memory device of claim 6, wherein the row decoder is disposed in a center of the peripheral circuit block to be surrounded by the other peripheral circuits.

9. The nonvolatile memory device of claim 6, wherein the peripheral circuit region further comprises an additional circuit block disposed between the page buffer block and the peripheral circuit block, and the additional circuit block performs a multiply and accumulate (MAC) operation on a value stored in the page buffer.

10. The nonvolatile memory device of claim 1, wherein the channel region comprises nanowires, and each of the plurality of vertical transistors comprises a gate electrode surrounding the channel region.

11. The nonvolatile memory device of claim 1, wherein the page buffer block further comprises a plurality of page buffers corresponding to the plurality of memory cells, and each of the plurality of page buffers comprises a latch structure implemented by four vertical transistors.

12. A nonvolatile memory device, comprising:
a memory cell region comprising a first semiconductor substrate and a plurality of memory cells disposed on the first semiconductor substrate, the plurality of memory cells being defined by gate electrodes stacked and spaced apart from each other and channel structures penetrating through the gate electrodes and connected to the first semiconductor substrate; and
a peripheral circuit region disposed below the memory cell region, and comprising a second semiconductor substrate and peripheral circuits disposed on the second semiconductor substrate and controlling the plurality of memory cells, the peripheral circuits comprising a page buffer, a row decoder, and other peripheral circuits,
wherein the page buffer is connected to the memory cell region through a connection portion penetrating through the first semiconductor substrate, the page buffer comprising a plurality of vertical transistors each defined by a source region, a channel region, and a drain region stacked in sequence in a first direction perpendicular to an upper surface of the first semiconductor substrate, and is distinguished from the row decoder and the other peripheral circuits in a second direction perpendicular to the first direction.

13. The nonvolatile memory device of claim 12, wherein the page buffer further comprises a plurality of page buffers corresponding to the plurality of memory cells, respectively.

14. The nonvolatile memory device of claim 13, wherein each of the plurality of page buffers comprises a latch structure implemented by four vertical transistors among the plurality of vertical transistors, and the plurality of vertical transistors are disposed two by two in the first direction.

15. The nonvolatile memory device of claim 12, wherein the row decoder is disposed in a center area of the peripheral circuit region.

16. A storage device, comprising:
a first semiconductor structure comprising a memory cell region comprising a first semiconductor substrate and a plurality of memory cells disposed on the first semiconductor substrate, and a first metal pad disposed on the memory cell region, the memory cell region further comprising gate electrodes stacked and spaced apart from each other on the first semiconductor substrate and channel structures penetrating through the gate electrodes and connected to the first semiconductor substrate; and
a second semiconductor structure comprising a peripheral circuit region comprising a second semiconductor substrate and a page buffer disposed on the second semiconductor substrate, and a second metal pad disposed on the peripheral circuit region,
wherein the page buffer comprises a plurality of vertical transistors performing a sensing operation on the plurality of memory cells and defined by a source region, a channel region, and a drain region stacked in sequence in a first direction perpendicular to an upper surface of the first semiconductor substrate, and the first metal pad and the second metal pad are bonded to each other in the first direction perpendicular to the upper surface of the first semiconductor substrate.

17. The storage device of claim 16, wherein the peripheral circuit region further comprises other peripheral circuits, and the page buffer is disposed between the first semiconductor structure and the other peripheral circuits.

18. The storage device of claim 16, further comprising:
a third semiconductor structure comprising a third semiconductor substrate, a memory controller formed on the third semiconductor substrate, and a connection structure penetrating through the second semiconductor substrate and connected to the second semiconductor structure, where the memory controller is configured to control an operation for the plurality of memory cells based on a signal applied from a host.

19. The storage device of claim 18, wherein the third semiconductor structure further comprises a third metal pad electrically connected to the memory controller through a connection via penetrating through the third semiconductor substrate.

20. The storage device of claim 19, wherein the memory controller is further configured to:
convert a control command transmitted from the host through the third metal pad into a control signal, and apply the control signal to the first semiconductor structure or the second semiconductor structure.

* * * * *